(12) United States Patent
Mett et al.

(10) Patent No.: US 7,088,101 B2
(45) Date of Patent: Aug. 8, 2006

(54) AQUEOUS SAMPLE HOLDER FOR EPR AND MR SPECTROSCOPY

(75) Inventors: Richard Raymond Mett, Cedarburg, WI (US); James Stewart Hyde, Dousman, WI (US); Jason Walter Sidabras, Milwaukee, WI (US)

(73) Assignee: Molecular Specialties, Inc., Milwaukee, WI (US)

( * ) Notice: Subject to any disclaimer, the term of this patent is extended or adjusted under 35 U.S.C. 154(b) by 40 days.

(21) Appl. No.: 10/898,120

(22) Filed: Jul. 23, 2004

(65) Prior Publication Data

US 2005/0017720 A1   Jan. 27, 2005

Related U.S. Application Data

(60) Provisional application No. 60/490,042, filed on Jul. 25, 2003.

(51) Int. Cl.
*G01V 3/00* (2006.01)

(52) U.S. Cl. ............................ 324/321; 324/316
(58) Field of Classification Search .............. 324/321, 324/316, 318
See application file for complete search history.

(56) References Cited

U.S. PATENT DOCUMENTS

| 3,358,222 A | 12/1967 | Hyde |
| 3,559,043 A | 1/1971 | Hyde |
| 3,757,204 A | 9/1973 | Hyde |
| 3,931,569 A | 1/1976 | Hyde |
| 4,446,429 A | 5/1984 | Froncisz et al. |
| 5,552,709 A * | 9/1996 | Anderson .................... 324/321 |
| 6,462,546 B1 * | 10/2002 | Schmalbein et al. ......... 324/316 |
| 6,633,161 B1 * | 10/2003 | Vaughan, Jr. ............... 324/318 |

OTHER PUBLICATIONS

James S. Hyde, A New Principle For Aqueous Sample Cells for EPR, The Review of Scientific Instruments, Apr. 1972, vol. 43, No. 4, pp. 629-631

* cited by examiner

*Primary Examiner*—Louis M. Arana
(74) *Attorney, Agent, or Firm*—Quarles & Brady LLP

(57) ABSTRACT

A sample holder for use in an EPR spectrometer is extruded using a material having a low dielectric constant. The extruded sample holder has a plurality of channels formed in it for holding sample material for testing. The shape and orientation of these channels are such that losses due to the high dielectric constant of the sample are minimized. Sample holders for cylindrical and rectangular cavity resonators and uniform field cavity resonators are disclosed, as well as for two-gap and four-gap loop-gap resonators.

26 Claims, 9 Drawing Sheets

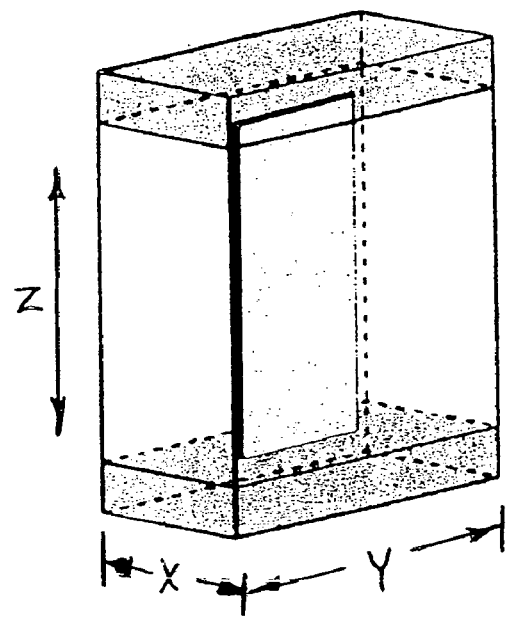
FIG. 3
FIG. 4
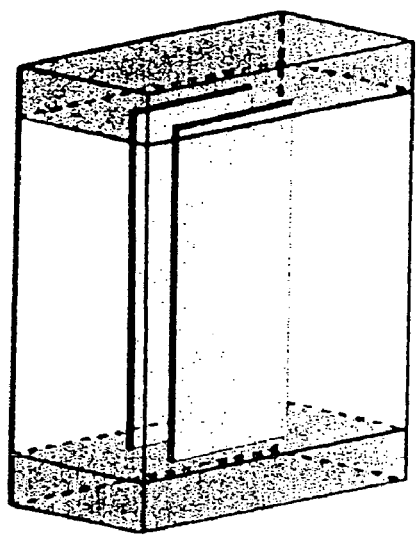
FIG. 5
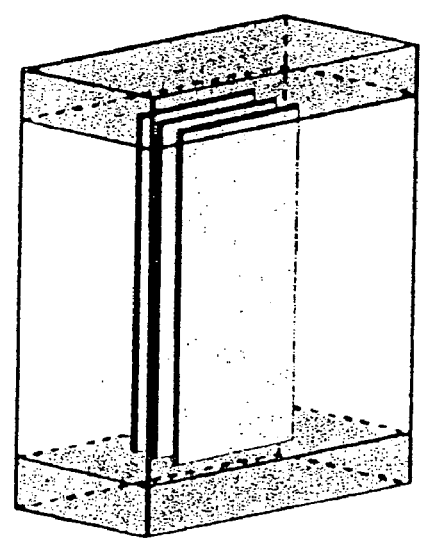

one sample two samples three samples

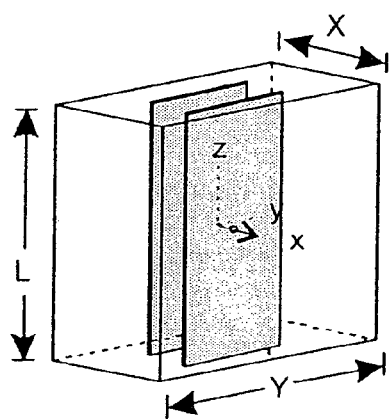
FIG. 7d
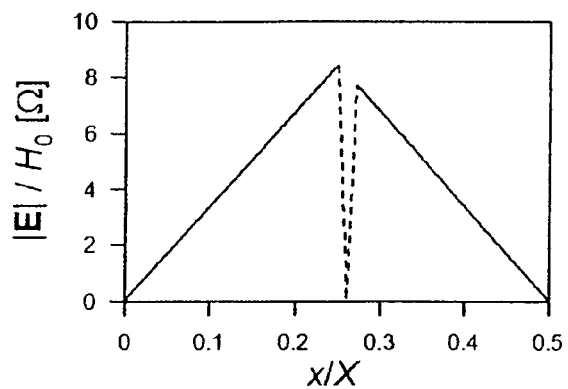
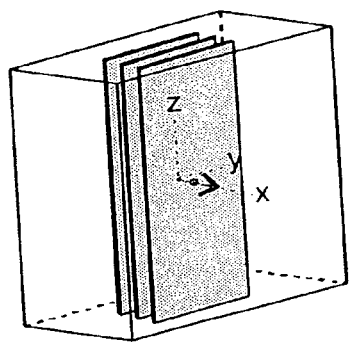
FIG. 7e
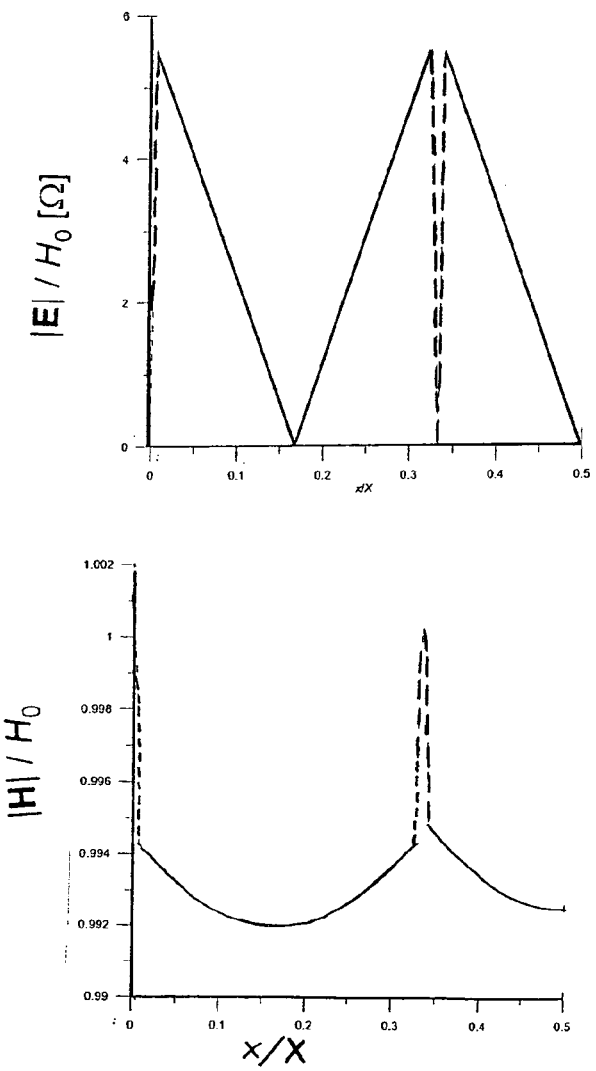

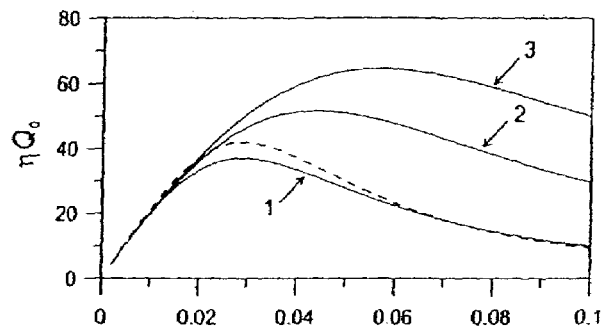
FIG. 8a
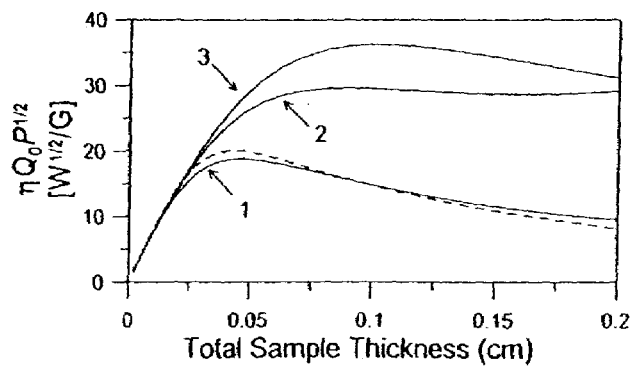
FIG. 8b
FIG. 9a
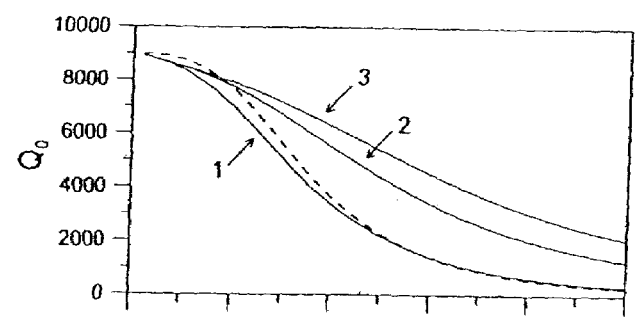
FIG. 9b
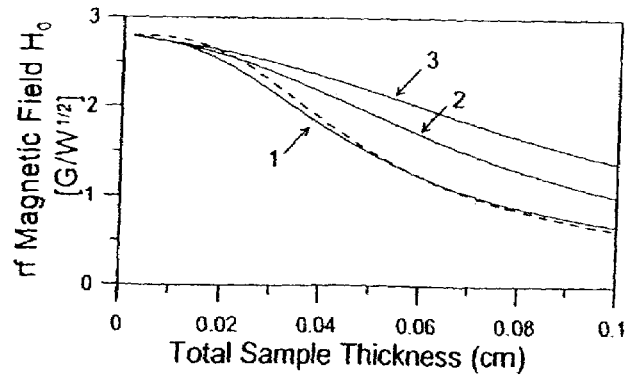

AQUEOUS SAMPLE HOLDER FOR EPR AND MR SPECTROSCOPY

CROSS-REFERENCE TO RELATED APPLICATIONS

This application claims the benefit of U.S. Provisional patent application Ser. No. 60/490,042 filed on Jul. 25, 2003 and entitled "Aqueous Flat Cells Perpendicular To The Electric Field For Use In Electron Paramagnetic Spectroscopy".

STATEMENT REGARDING FEDERALLY SPONSORED RESEARCH

This invention was made with government support under Grant No. RO1 EB001417 awarded by the National Institute of Health. The United States Government has certain rights in this invention.

BACKGROUND OF THE INVENTION

The field of the invention is electron paramagnetic resonance (EPR) and magnetic resonance (MR) spectroscopy, and particularly, the disposition of samples to be examined in such spectroscopy systems.

Electron paramagnetic resonance spectroscopy is conducted to study electrons which are in a paramagnetic state and which is called electron paramagnetic resonance (EPR) or electron spin resonance (ESR). In electron paramagnetic resonance spectroscopy a sample to be investigated is subjected to a polarizing magnetic field and one or more radio frequency magnetic fields. The frequency, strength, direction, and modulation of the applied magnetic fields vary considerably depending upon the particular phenomena being studied. Apparatus such as that disclosed in U.S. Pat. Nos. 3,358,222 and 3,559,043 have been employed for performing such experiments in laboratories. Samples which are the subject of the EPR measurement are placed in a microwave resonator where they are subjected to the RF magnetic field. The microwave resonator may take the form of a cavity resonator such as that disclosed in U.S. Pat. Nos. 3,931,569 and 3,757,204, or it may be a loop-gap resonator such as that disclosed in U.S. Pat. No. 4,446,429. A major objective of the resonator is to enhance the RF magnetic field throughout the extent of the sample.

Loop-gap resonators (LGR) have become a preferred resonator geometry for experiments at frequencies below X band. Cavity resonators are generally preferred at higher frequencies to about 100 GHz, with Fabry-Perot resonators preferred at ultrahigh frequencies. Both LGRs and cavity resonators are in common use at X-band (10 GHz), Q-band (35 GHz) and S-band (3 GHz), which are by far the most widely used frequency for EPR experiments. The reason for these preferences is primarily convenience. Cavity resonators are awkwardly large at S band, LGRs become extremely small at Q band, and cavity resonators are, in turn, too small to handle easily at ultrahigh frequencies.

A benefit of LGRs is that the length to diameter ratio of the sample-containing loop is typically about five, resulting in a relatively uniform microwave field over the sample. This is a substantial benefit in experiments using line samples that extend through the resonator, since all portions of the sample respond in the same way to the incident microwave field. For cavity resonators on the other hand, the microwave field varies cosinusoidally over the sample, with the number of half cycles of variation determined by the selected index of the microwave resonant mode—usually one half cycle.

Recently, uniform field (UF) microwave cavity resonance modes for use in EPR spectroscopy were introduced. These modes consist of three sections, a central section in which the fields are uniform in the dimension corresponding to the axis of the section, and two end sections that are each effectively ¼ wavelength long. Three ways were found to design the end sections: filling with dielectric, making them oversize, or making them re-entrant. A rectangular $TE_{102}$ UF ($TE_{U02}$) resonator with dielectric end sections and an inserted aqueous sample cell is illustrated in FIG. 2. This structure is described in detail in copending U.S. patent application Ser. No. 10/200,885 filed on Jul. 23, 2002 and entitled "Cavity Resonator Having Axially Uniform Field".

The earliest discussion of how aqueous samples are mounted in EPR resonators considered the rectangular $TE_{102}$ cavity resonator, which has a central nodal plane at the sample position where the RF electric field is zero and the RF magnetic field is a maximum. A so-called "flat cell" was employed that constrained an aqueous sample in a thin slab lying in this plane, and obtained improved performance relative to use of a sample contained in cylindrical capillary.

It has been observed by several workers using the rectangular $TE_{102}$ cavity that when the flat cell is rotated a few degrees, the resonator Q-value becomes very poor, but if it is rotated precisely 90°, the Q-value recovers and good EPR signals can be obtained that are of similar intensities to signals obtained in the "parallel" orientation. A model to explain this surprising result was described by J. S. Hyde "A New Principle For Aqueous Sample Cells For EPR," Rev. SCI. Instrum. 43 (1974) 629–631, and he also disclosed insertion of more than one flat cell in this "perpendicular" orientation. Thus, it was established 30 years ago that there are two fundamental physical principles that govern aqueous sample cell geometries in EPR spectroscopy: placement in electric field nodes and surface orientation perpendicular to E. While this qualitative fact has been known for many years, no theoretical analysis has been performed which yields quantitative facts that enable this discovery to be exploited in a practical and optimal way.

SUMMARY OF THE INVENTION

The present invention is a result of an analytic solution of the Maxwell equations for an aqueous flat cell sample in an EPR resonator. More specifically, the invention is a multi-channel aqueous sample cell holder for use in a resonator in which the channels containing sample to be tested are separated by dielectric septa and the surfaces of each septa are substantially perpendicular to the radio frequency electric field produced in the resonator.

A general object of the invention is to increase the signal produced by a sample in a spectroscopy resonator. By forming a sample holder that defines a plurality of channels that contain a high dielectric sample material, and shaping the channels such that the boundaries of each channel are substantially perpendicular to the electric field produced in the resonator, losses are reduced and the responsive signal produced by excited sample is increased.

Another object of the invention is to further increase the signal produced by a sample contained in a sample holder. This is achieved by constructing the sample holder of a material having a dielectric constant of substantially less than 2.0. An additional signal increase of up to 50% can be achieved by using a polymer foam.

Another object of the invention is to increase the signal produced by resonators of different shapes and functional modes of operation. Different electric fields are produced within the resonator cavity depending on its shape and the mode of its operation. Regardless, a sample holder can be formed such that its multiple channels orient the sample material boundaries substantially perpendicular to the electric field. To the extent this is achieved, losses are reduced and the signal produced by the sample during a spectroscopy measurement is increased.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 3 is a pictorial representation of the cavity resonator of FIG. 2 with the flat sample in the perpendicular orientation;

FIG. 4 is a pictorial representation of the cavity resonator of FIG. 2 with two flat samples in the perpendicular orientation;

FIG. 5 is a pictorial representation of the cavity resonator of FIG. 2 with three flat samples in the perpendicular orientation;

FIGS. 7A–7E are graphs for $TE_{102}$ spatial field profiles for the pictorial flat sample configurations;

FIGS. 8A and 8B are graphs of $TE_{102}$ cavity resonator sample EPR signal strength as a function of sample thickness for respective non-saturable and saturable samples, where the dashed lines are for a single cell oriented in the nodal plane and the solid lines are for 1, 2 and 3 cells oriented in the perpendicular direction;

FIGS. 9A and 9B are graphs of unloaded $Q_0$ of the resonator as a function of sample thickness and RF magnetic field strength as a function of sample thickness, where the dashed lines are for a single cell oriented in the nodal plane and the solid lines are for 1, 2 and 3 cells oriented in a perpendicular direction;

GENERAL DESCRIPTION OF THE INVENTION

Figure 1:
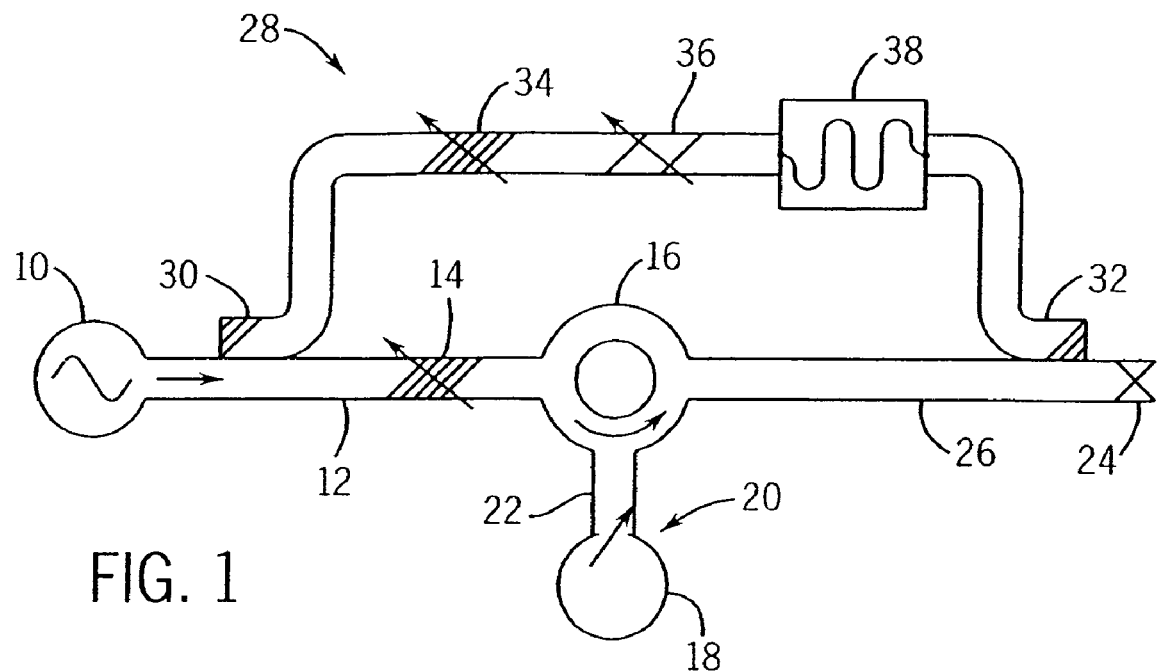
FIG. 1 is a schematic diagram of a microwave bridge in an EPR spectrometer which employs resonators according to the present invention.

This analysis is concerned with aqueous EPR samples in both standard and perpendicular sample orientations for both cosine $TE_{102}$ and axially uniform $TE_{U02}$ rectangular resonator geometries. The UF mode is generally treated with uniform central section and cosine dielectric end sections, while the standard cosine rectangular $TE_{102}$ mode is a subset of the formalism. Flat-cell samples of various cross sections and widths extending the length of the central section, or in the case of $TE_{102}$, the entire resonator length are considered. Analytical solutions of electromagnetic field distributions at X-band (9.5 GHz) are obtained, extending the work to the perpendicular sample orientation and to multiple sample regions. The analysis here is exact for the case of the sample width extending over the entire y-axis cavity dimension. Because this situation may not be of practical interest for the perpendicular orientation, an analytic approximation to account for the electric field enhancement on the sample edge that occurs when the sample width is smaller than the cavity Y dimension (viz "limited sample") is introduced. The field integrals were modified accordingly.

The analysis begins with the field solutions for the rectangular $TE_{102}$ mode, perpendicular sample orientation. This geometry is shown in FIG. 3, where the y-axis is perpendicular to the electric field modal plane. The case of the rectangular $TE_{102}$ mode is envisaged by ignoring the dielectric end sections. When the sample extends across the cavity in the y direction, the magnetic field component $H_x=0$. All three components of electric field E are present, unlike the standard sample orientation. This implies that the sample breaks the TE nature of the cavity mode. Because only $H_x=0$ in the presence of sample, the mode is transverse magnetic (TM) to the x-direction. Of course, the mode can also be labeled a TM mode in the standard sample orientation or before sample insertion, since $H_x=0$ in these cases as well, and so the difference at this point is semantic. But when the sample is in the perpendicular orientation, the mode is not TE, but rather TM. The TM in x designation in the presence of sample implies that one can derive a solution based on a transverse scalar potential wave function $\psi(y, z)$, which is the transverse dimension (y, z) functional dependence of the longitudinal electric field $E_x(x, y, z)$. This is the only scalar solution that permits all five of the observed field components to be obtained.

Accordingly, the theory of transverse material discontinuity is cast into the rectangular geometry shown in FIG. 3. The (lossy) material (which can be the sample or dielectric ends) plane of discontinuity has three possible orientations: 1) the x-y plane, which corresponds to the dielectric ends; 2) the y-z plane, which is the standard nodal configuration; and 3) the x-z plane, which is the perpendicular orientation. Case 1 has been analyzed in the context of a TE mode as described by Mett et al "Axially Uniform Resonant Cavity Modes For Potential Use In Electron Paramagnetic Resonance Spectroscopy," Rev. Sci. Instrum. 72 (2001) 4188–4200. These analyses and results are transferable to the perpendicular orientation because when the mode is uniform in the central section, the fields are again purely TE both there and at the dielectric interface. The fields are not TE in the end section, but are derivable there from the perpendicular analysis given below. As the UF mode departs from uniformity in the central section, the mode becomes a mixed TE and TM mode. Case 2 above has also been analyzed as a TE mode and the results integrated with case 1 by Hyde et al, "Aqueous Sample Consideration In Uniform Field Resonators For Electron Paramagnetic Resonance Spectroscopy," Curr. Top. Biophys. 26 (2002) 29–36. Here, the fields (and wave functions) are uniform in dimension x. Results for the first two cases in the context of the TM analysis below are summarized in Appendix A. In this analyses, fields vary periodically in time as $e^{-i\omega t}$.

Figure 6A:
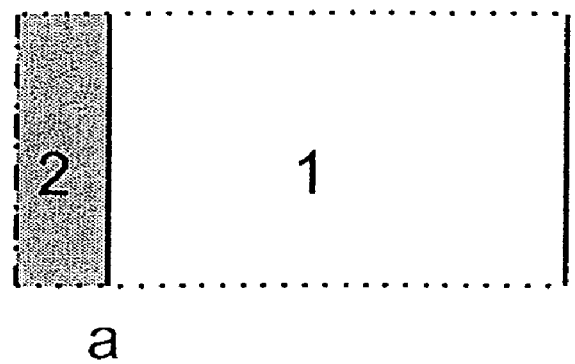
FIGS. 6A–6C are schematic drawings of the index definitions for the space and sample regions for the respective 1, 2 and 3 flat sample embodiments of FIGS. 3, 4 and 5.
Figure 6B:
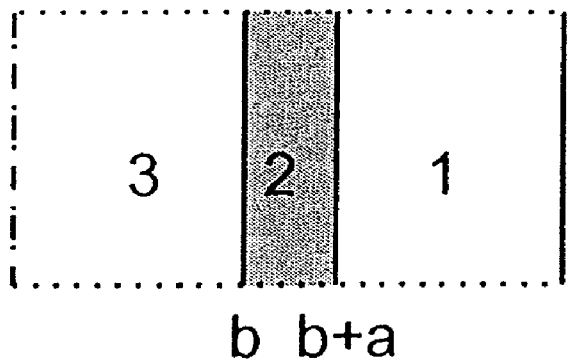
Figure 6C:
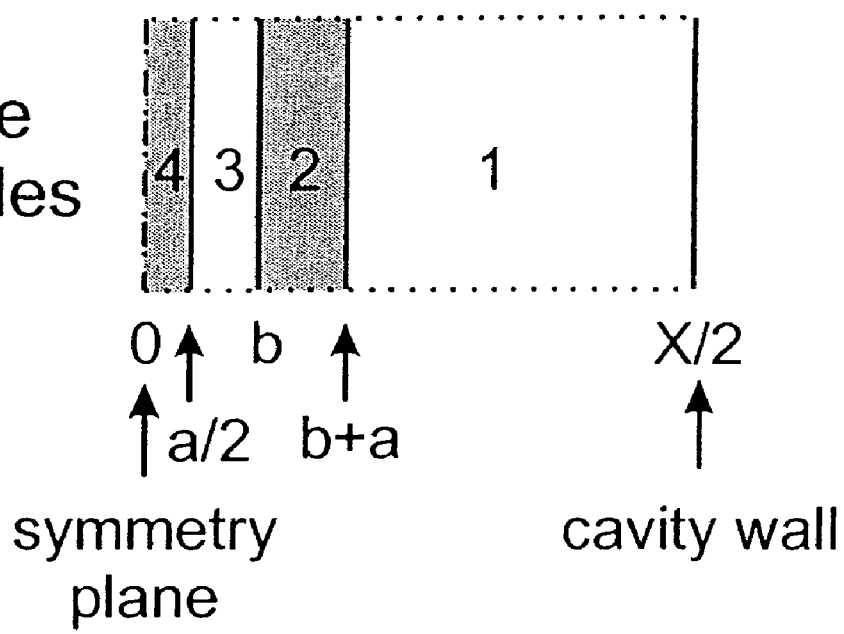

Consider case 3: the sample(s) oriented perpendicular to the nodal plane as shown in FIG. 3. Symmetry about x=0 is assumed. It is also assumed initially that the sample width in y extends across the entire cavity, $y=\pm Y/2$. The enhancement of the electric field at the sample edge is empirically modeled when the sample width $Y_s$ is limited, $Y_s<Y$. The various sample and vacuum dielectric regions in the central section are labeled, starting from the outside (region 1), as shown in FIG. 6. For example, FIG. 4 illustrates a two-sample configuration. As shown in FIG. 6, this configuration is mathematically described as a symmetric three-dielectric region problem with the outer vacuum space labeled region 1, the sample labeled as region 2, and the inner vacuum space as region 3. No matter how many regions there are, the electromagnetic cavity mode is a TM mode transverse to x, and inside any of these regions, $E_x$ is related to the transverse scalar wave function $\psi$ as:

$$E_x = E_0(A \cos \gamma x + B \sin \gamma x)\psi(y, z), \quad (1)$$

where $E_0$ represents the RF electric field peak amplitude in the cavity, A and B are (field amplitude) constants determined by the boundary conditions in x, the x wavenumber $\gamma$ takes on different values in the different dielectric regions, and the transverse wave function $\psi$ in the central section can be written $$\psi_c = \sin \eta y \cos k_1 z. \quad (2)$$

Here, the y wavenumber $\eta$ is fixed by the TM conductive boundary condition $\psi|_{y=Y/2}=0$ as $$\eta=2\pi/Y, \quad (3)$$

while the axial wavenumber $k_1$ depends on matching to the dielectric end section. The other four field components are derivable from the scalar potential according to $$E_t = \frac{E_0 \gamma}{\eta^2 + k^2}(A\sin \gamma x - B\cos \gamma x)\nabla_t \psi, \quad (4)$$

$$H_t = \frac{i\varepsilon\omega E_0}{\eta^2 + k^2}(A\cos \gamma x + B\sin \gamma x)\hat{x} \times \nabla_t \psi, \quad (5)$$

where $\hat{x}$ represents a unit vector in the x-direction, $\nabla_t$ represents the transverse gradient, $\nabla-\hat{x}\partial/\partial x$, and $\in$ represents the dielectric constant. Note that Eqs. (4) and (5) are applicable in any region. From Eq. (5), it can be shown that the electric field amplitude $E_0$ is related to the magnetic field amplitude at the coordinate origin, $H_0$, by $$E_0 = \frac{-iH_0}{\omega\varepsilon\eta}(\eta^2 + k^2). \quad (6)$$

In the two x-region problem shown in FIGS. 3 and 6, which has one sample, we have in the sample (i.e. region 2, 0<x<a), Eq. (1), with $$A_2=1, \quad (7)$$

$$B_2=0, \quad (8)$$

$$E_{x2}=E_0 \cos \gamma_2 x \, \psi_c \quad (9)$$

In the free space, region 1, a<x<X/2, $$E_{x1}=E_0 C_1 \cos[\gamma_1(X/2-x)]\psi_c, \quad (10)$$

with $C_1$ determined by the continuity of displacement at x=a. From Eqs. (9) and (10), $$C_1=\in_{rs} \cos \gamma_2 a/\cos[\gamma_1(X/2-a)], \quad (11)$$

where $\in_{rs}$ represents the relative dielectric constant of the sample (the dielectric constant normalized to that of free space). From Eqs. (1) and (11), $$A_1=C_1 \cos(\gamma_1 X/2), \quad (12)$$

$$B_1=C_1 \sin(\gamma_1 X/2). \quad (13)$$

Imposing the continuity of $\partial E_x/\partial x$ across the sample interface x=a (which produces continuity of tangential electric and magnetic field) using Eqs. (9) and (10) produces an interface relation between the x wavenumbers, $$\gamma_1 \tan[\gamma_1(X/2-a)] = -\frac{\gamma_2}{\varepsilon_{rs}} \tan \gamma_2 a. \quad (14)$$

This equation is analogous to the interface relationships of Eqs. (A7) and (A12), but is different due to the polarization of the electric field perpendicular to the dielectric plane.

In the dielectric end section, the wave function reads $$\psi_e = \frac{\cos(k_1 L/2)}{\sin k_2 d} \sin \eta y \sin[k_2(L/2 + d - z)], \quad (15)$$

where $k_2$ is the axial wavenumber in the end section. As recapped in Appendix A, the wave functions are matched across z=L/2, and continuity of $\partial \psi/\partial z$ gives an interface relationship between $k_1$ and $k_2$, $$k_1 \tan k_1 L/2 = k_2 \cot k_2 d. \quad (16)$$

The system of five equations and five "unknown" mode constants $\psi, \gamma_1, \gamma_2, k_1, k_2$ is formed by Eqs. (14) and (16) and completed with a dispersion relation for each of the three different dielectric regions $$\omega^2/c^2 = \gamma_1^2 + \eta^2 + k_1^2, \quad (17)$$

$$= (\gamma_1^2 + \eta^2 + k_2^2)/\varepsilon_{re}, \quad (18)$$

$$= (\gamma_2^2 + \eta^2 + k_1^2)/\varepsilon_{rs}, \quad (19)$$

where $\in_{re}$ refers to the relative dielectric constant of the end section dielectric. The fields are expressed in terms of these five mode constants. Effectively, by using Eqs. (18) and (19), we are not accounting for sample extension into the dielectric end section. A brief discussion of the end section thickness d in relation to the system of equations is given in Appendix A. Explicit expressions for the fields and the amplitude constants A and B are given in Appendix B.

In the three-x-region problem shown in FIGS. 4 and 6, which has two samples separated by a distance $2b$, we have in the inner free space region 3, $0<x<b$, $$E_{x3} = E_0 \cos \gamma_1 x \psi_c, \quad (20)$$

where, since the dispersion relation in region 3 is identical to that of region 1, the result that $\gamma_3 = \gamma_1$ is used, which represents the x-wavenumber in free space. In the sample region 2 ($b<x<a+b$), $$E_{x2} = E_0 C_2 \cos[\gamma_2(X_2/2-x)]\psi_c, \quad (21)$$

with $C_2$ determined by the continuity of displacement at the sample interface $x=b$. Here, $X_2$ represents an equivalent (complex) phase constant to be determined. It is found from Eqs. (20) and (21) that $$C_2 = \frac{\cos\gamma_1 b}{\varepsilon_{rs}\cos[\gamma_2(X_2/2-b)]}. \quad (22)$$

In the outer free space, region 1 ($a+b<x<X/2$), $$E_{x1} = E_0 C_1 \cos[\gamma_1(X/2-x)]\psi_c, \quad (23)$$

with $C_1$ determined by the continuity of displacement at the sample interface $x=a+b$. From Eqs. (21) and (23), $$C_1 = C_2 \varepsilon_{rs} \cos[\gamma_2(X_2/2-a-b)]/\cos[\gamma_1(X/2-a-b)]. \quad (24)$$

Imposing continuity of $\partial E_x/\partial x$ across the sample interfaces at $x=b$ and $x=a+b$ using Eqs. (20), (21) and (23) combined with Eqs. (22) and (24) yields a pair of interface equations that relate the three mode constants $\gamma_1$, $\gamma_2$, and $X_2$, $$\gamma_1 \tan\gamma_1 b = -\frac{\gamma_2}{\varepsilon_{rs}} \tan[\gamma_2(X_2/2-b)]. \quad (25)$$

$$\gamma_1 \tan[\gamma_1(X/2-a-b)] = \frac{\gamma_2}{\varepsilon_{rs}} \tan[\gamma_2(X_2/2-a-b)]. \quad (26)$$

The system of equations now contains six mode constants, $\psi$, $\gamma_1$, $\gamma_2$, $X_2$, $k_1$, $k_2$ formed by Eqs. (25), (26) and (16)–(19). Explicit expressions for the amplitude constants A and B in each region along with the fields are given in Appendix B, as well as appropriate expressions for the four-x-region problem (three-sample configuration) shown in FIGS. 1(d) and 2(c).

In all cases, the system of equations for the $TE_{102}$ mode is obtained from the equations above by eliminating Eqs. (16) and (18) from the system, setting $k_1=\pi/L$, and ignoring the fields in the end section. The solution is exact for the $TE_{102}$ mode for the case that the sample widths extend fully across the cavity to $y=\pm Y/2$.

If the sample width is limited to $y=\pm Y_s/2$ where $Y_s<Y$, the primary effect is to cause the x-component of electric field near the edge of the sample $y\leq Y_s/2$ to increase over what it would be if the sample extended fully across the Y cavity dimension.

When the sample extends fully across the cavity, $Y_s=Y$, the x-component of the electric field inside the sample $E_{xi}$, is reduced relative to the field outside the sample $E_{x0}$ according to $$E_{xi} = E_{x0}/\varepsilon_{rs} \quad (27)$$

due to conservation of electric displacement. Here, the relative dielectric constant is $\varepsilon_{rs}$. Although Eq. (27) is applicable to a dielectric slab in a constant external electric field $E_{x0}$ oriented perpendicular to the planar surface of the slab, Eq. (27) accurately describes the relationship between $E_x$ inside the sample and that outside for the $TE_{102}$ mode, despite the sinusoidal variation of the field in y. $E_{xi}$ and $E_{x0}$ are functions of y.

For limited sample, HFSS observations of the fields over a wide range of conditions and realistic sample thicknesses revealed that Eq. (27) is also accurate several sample thicknesses away from the sample edge, $y \leq Y_s/2 - 3a$. Further HFSS observations led to the conclusion that the electric field magnitude near the sample edge $y=Y_s/2$ was always about double the value farther inside the sample, $y \leq Y_s/2 - 3a$, given by Eq. (27). This can be explained by considering the electrostatic field inside a dielectric cylinder with axis perpendicular to x in a constant external field $E_{x0}$. The relationship between the field inside the cylinder and that outside of it is:

$$E_{xi} = \frac{2E_{x0}}{\varepsilon_{rs} + 1}, \quad (28)$$

where $E_{x0}$ represents the field far from the cylinder. (The field inside the cylinder is uniform.) From Eq. (28), it can be seen that the field is stronger inside the cylinder by about a factor of two over that inside a flat cell. This increase is caused by the continuity of tangential electric field at the edges of the cylinder. In the actual $TE_{102}$ limited sample case, in the limit $a<<Y_s/2$, the field $E_{xi}$ at the edge of the plane $y=Y_s^-/2$ and at $x=0$ consistently is surprisingly close to what was predicted by Eq. (28) for a wide range of sample sizes. Apparently, the edge of the flat cell, after rounding off the sharp corners, can be thought of as approaching some reasonable fraction of a cylinder. Moreover, it was observed that the field decays approximately exponentially with ($Y_s-y$) to a value predicted by Eq. (27) over a characteristic distance equal to about the sample plane half thickness a.

Parenthetically, it may be recalled that for a sphere, the relationship analogous to Eq. (28) is $$E_{xi} = \frac{3E_{x0}}{\varepsilon_{rs} + 2}. \quad (29)$$

Figure 2:
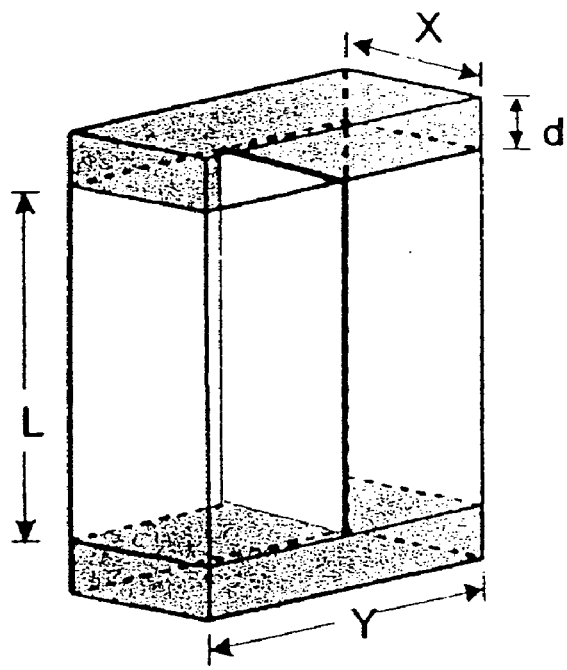
FIG. 2 is a pictorial representation of a uniform field cavity resonator $TE_{U02}$ with a flat sample in the conventional, nodal plane orientation

Consequently, in order for the field inside a dielectric with $\varepsilon_{rs}>1$ to be comparable to that outside, most of the dielectric interface must lie along the electric field, as in case 1, the end dielectric, or case 2, FIG. 2.

According to the observations, the sample edge enhancement of the electric field was empirically modeled by multiplying the field expression for $E_{xc}$ given by Eq. (B1) inside the sample by $$(1+C_E e^{-(Y_s/2-y)/a}), \quad (30)$$

where the edge field enhancement factor $C_E$, according to Eq. (28) and the discussion above, should be about two.

After including the effect of this enhanced $E_{xc}$ in the expressions for the losses and field energy, the magnitude of the constant $C_E$ was adjusted until a match between the Q value predicted by the analytic expressions matched that predicted by Ansoft HFSS for a representative sample size. The $TE_{102}$ mode was used at 9.5 GHz with $a=0.1$ mm, $Y_s=0.4$ inches, and found to be $C_E=2.27$ for unloaded $Q=6885$. For this value of $C_E$, the unloaded Q predicted by the analytic theory was within 1.5% of Ansoft HFSS when the sample thickness was doubled. Agreement improved to 0.6% with the sample thickness doubled and the width halved.

In summary, the field energy and losses were analytically modeled for limited sample width by correcting the x-component of the electric field near the sample edge according to Eq. (30) and integrating over the reduced sample width. The stored energy in vacuum was also adjusted by integrating the value of the field just outside the removed sample regions over the vacuum regions no longer occupied by the limited sample.

In consideration of energy balance for time harmonic fields in the presence of lossy dielectrics, expressions were obtained for the stored energy W and dissipated power $P_l$ in the cavity in terms of the preceding expressions for the fields:

$$W = W_v + W_d + W_s, \quad (31)$$

where $$W_v = \frac{1}{2}\varepsilon_0 \int_{vacuum} E \cdot E^* dV, \quad (32)$$

$$W_d = \frac{1}{2}\varepsilon_0 \mathrm{Re}(\varepsilon_{rd}) \int_{end\ dielectrics} E \cdot E^* dV, \quad (33)$$

$$W_s = \frac{1}{2}\varepsilon_0 \mathrm{Re}(\varepsilon_{rs}) \int_{sample} E \cdot E^* dV, \quad (34)$$

and $$P_l = P_w + P_d + P_s, \quad (35)$$

where $$P_w = (2\sigma\delta)^{-1} \int_{walls} (\hat{n} \times H) \cdot (\hat{n} \times H)^* dS, \quad (36)$$

$$P_d = \mathrm{Re}(\omega)\varepsilon_0 \mathrm{Im}(\varepsilon_{rd}) \int_{end\ dielectrics} E \cdot E^* dV, \quad (37)$$

$$P_s = \mathrm{Re}(\omega)\varepsilon_0 \mathrm{Im}(\varepsilon_{rs}) \int_{sample} E \cdot E^* dV. \quad (38)$$

In Eq. (36), $\sigma$ is the wall conductivity and the skin depth $\delta = (\pi f \mu_0 \sigma)^{-1/2}$, where $f = \psi/2\pi$. Further, integrals representing the nonsaturable and saturable signal strengths were formed, $$S_u = (P_{in}^{1/2}/P_l) \int_{sample} H \cdot H^* dV, \quad (39)$$

$$S_s = P_l^{-1/2} \int_{sample} H \cdot H^* dV. \quad (40)$$

It is noted that $\eta Q_0 = \pi f \mu_0 S_u$ with $P_{in}^{1/2} = 1$, where $\eta$ is the filling factor and $Q_0$ is the unloaded Q. The loaded Q when the cavity is matched is two times smaller. In the nonsaturable case, the input power is set to some value, say 1 W, and the reference RF magnetic field strength $H_0$ cancels out of the expression. In the saturable case, the input power $P_{in}(=P_l)$ is adjusted to achieve a fixed value of $\mu_0 H_0$, say 1 G.

The integrals were evaluated analytically with the use of complex trigonometric identities such as $\sin\theta(\sin\theta)^* = \frac{1}{2}\cos[2\mathrm{Im}(\theta)] - \frac{1}{2}\cos[2\mathrm{Re}(\theta)]$. An example of the explicit expression for the integral $P_s$ is shown in Appendix C. Space constraints limit the display of the other evaluated integrals. The $Q_0$ value is given by $$Q_0 = \mathrm{Re}(\omega) W / P_l. \quad (41)$$

Note that $Q_0$ does not account for energies or losses in the thin neglected region, for the one sample configuration, $0 < x < a$, $L/2 < z < L/2 + d$, consistent with the field expressions. Additional neglected regions exist for multiple samples.

For purposes of comparison, the full wave calculations of all the preceding quantities were also found for the standard $TE_{102}$ mode. The reduced system of equations applicable to the $TE_{102}$ mode is explained briefly in Appendix A.

The system of equations was solved using the Mathematica 4.1 (Wolfram Research, Inc., 1999, Champaign, Ill.) root solver with the desired operating frequency, cavity dimensions and sample size specified. Calculations were carried out on a Compaq W8000 workstation with dual Intel Xeon 1.7 GHz Pentium processors. The operating frequency of the cavity without sample was set at 9.500 GHz. The dielectric ends (in the case of the UF mode) were taken as quartz, $\varepsilon_{rd} = 3.78(1+10^{-4}i)$ and the sample was taken as water at 25° C., $\varepsilon_{rs} = 55(1+0.54i)$. The conductivity of the walls was that of copper, $\sigma = 5.80 \cdot 10^7/(\Omega m)$. In Mathematica, the secant method was used with (complex) initial guesses based on the analytic limits of the equations with vanishing sample thickness. The sample thickness was scanned starting from a very small value and increasing. The results from the previous solution were then used to form the initial guesses for the next solution. With the resulting values of frequency, wavenumber, and phase constant from the solution, the appropriate expressions for the fields and field integrals were evaluated.

Figure 7A:
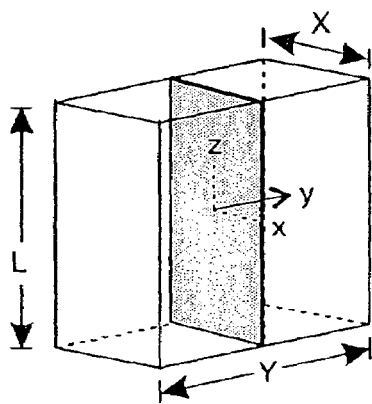
Figure 7A:
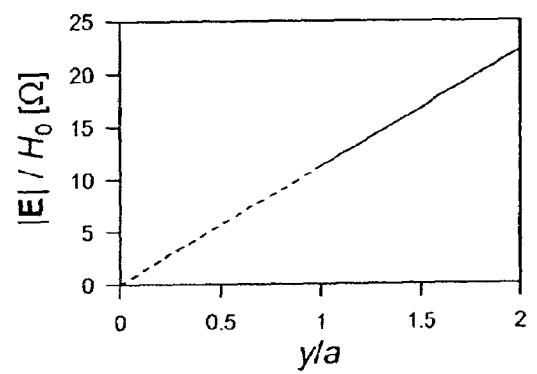
Figure 7B:
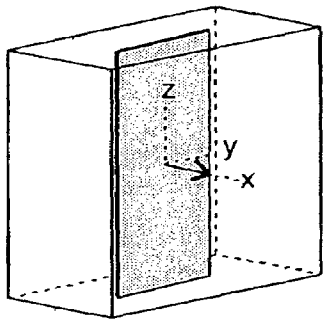
Figure 7B:
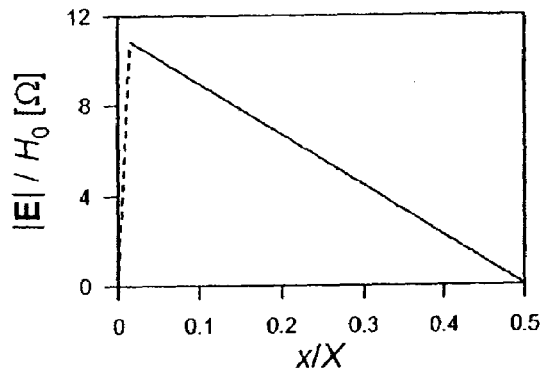
Figure 7C:
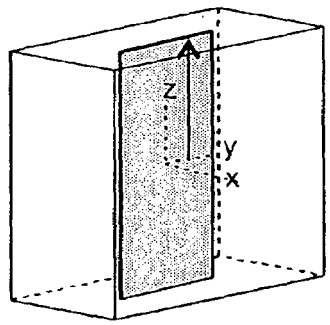
Figure 7C:
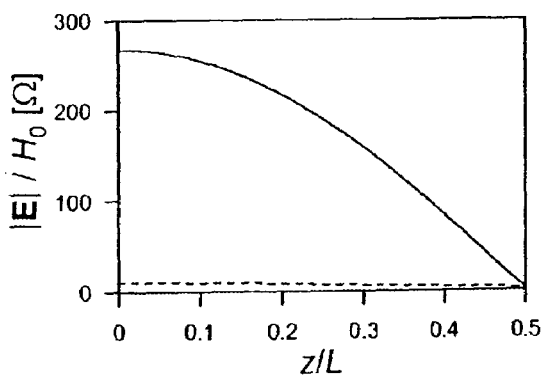

A strategy for maximizing signal is to minimize sample losses, which is done by minimizing E in the sample region(s). To accomplish this and to illustrate the constraints of the problem, several field plots for the $TE_{102}$ mode for optimum sample thickness are shown. The operating frequency was 9.5 GHz, cavity size X=1.02 cm, Y=4.36 cm, L=2.29 cm, and sample width $Y_s$=X. In all the field plots, the magnetic field magnitude in the center of the cavity (the coordinate origin) is normalized to 1 A/m. FIG. 7(a) shows a plot of the magnitude of electric field vs. y at x=0 and z=0 for the standard E-field nodal plane orientation. The electric field, which has only an x-component, increases linearly at the same rate inside and outside the sample. $E_x$, which is tangent to the surface, is conserved across the sample interface. FIG. 7(b) shows the analogous plot for the perpendicular orientation. This plot is made at the location y=0 and z=0, where (now the normal component) $E_x(x)=0$. It is shown at this location to illustrate that there is a tangential component of electric field that behaves similarly and has a similar magnitude to that of the standard orientation. At this particular location, the field consists of $E_y$ only, but at other y and z locations, the field is made up of both $E_y$ and $E_z$. This tangential component of electric field $E_t = E_y \hat{y} + E_z \hat{z}$ is due to the polarization charge on the surfaces of the sample and the conservation of tangential H at the boundary. Away from y=0 and z=0, the-component normal to the surface, $E_x$, is also found, which is reduced inside the sample by the ratio of the dielectric constants inside and outside the sample, as shown by Eq. (27). In FIG. 7(c), the electric field magnitude at a location x=a, y=$Y_s$/4 is shown inside and outside the sample. On the left side of the plot, the electric field in the sample is due to $E_x$ and $E_y$, while on the right side, there is no $E_x$. Because the tangential electric field components play such a large role in dissipation, FIGS. 7(d) and (e) show plots of $E_y$ (at y=0, z=0) for the two- and three-sample region cases. Perhaps surprisingly, each sample region has a tangential electric field null inside. In general, these nulls are not located in the center of each sample region, but rather move around with sample placement. Here, the sample spacing b was adjusted to maximize the signal, which also minimizes the loss by placing the null as close to the center of each sample region as possible. As will be discussed in the following section, these nulls are the reason multiple sample regions produce an enhanced signal in the perpendicular orientation. FIG. 7(f) shows the corresponding magnitude of magnetic field vs. x for the three-region case. As expected, it is nearly constant across the cavity.

Sample losses can be grouped into three types: 1) those due to electric field tangential to the sample surface; 2) those due to electric field normal to the sample surface; and 3) those due to electric field enhancement close to the edge of the limited sample width. Type 1 loss is proportional to the cube of the sample thickness, $a^3$, because this component of E has a null inside the sample and grows linearly with sample thickness. This type of loss is the only one present in the standard electric field nodal-plane orientation. It accounts for the rapid decrease in signal for sample thicknesses larger than optimal, as shown in the dashed curve of FIG. 8(a), and is present in the perpendicular orientation as well, the solid curves of FIG. 8(a). As was pointed out above, such a null surprisingly occurs for every separate sample region. The exact location of this null depends on the sample placement, but in any case, type 1 loss can be reduced by reducing the sample thickness and increasing the number of layers. This is seen in the increase in signal strength with number of samples at a given total sample thickness shown in FIG. 8(a). It is also illustrated in the increase in Q with number of sample regions in FIG. 9(a). When type 1 loss is negligible, the optimum sample thickness is theoretically without limit, as for the cylindrical capillary. This is also hinted at in FIGS. 8(a) and 9(a) where the signal and Q are seen to drop more slowly with increasing thickness for the three-sample case.

Type 2 loss is directly proportional to the sample thickness because the normal component of E, $(E_x)$, is relatively constant across the sample thickness. Type 2 loss is unique to the perpendicular orientation. This loss can be reduced in two ways. The first is by limiting the sample width, $Y_s$, so that the sample does not extend very far into the electric field. The electric field varies sinusoidally in y and goes to zero at the cavity walls y=Y/2. Consequently, this term increases as $Y_s^3$ for $Y_s<Y/4$. The second way to limit the size of this term is by having a sample with a large magnitude of relative dielectric constant. Since the electric field is inversely proportional to $\epsilon_r$ inside the sample, the loss is proportional to $\epsilon_r^{-2}$. For the case depicted in FIGS. 7 and 8, type 2 loss is considerably smaller than type 1 losses at optimum sample thicknesses.

Type 3 loss, which was speculated to be potentially important in the perpendicular orientation, is found to be only important when the sample width becomes comparable to or smaller than the sample thickness.

Figure 14:
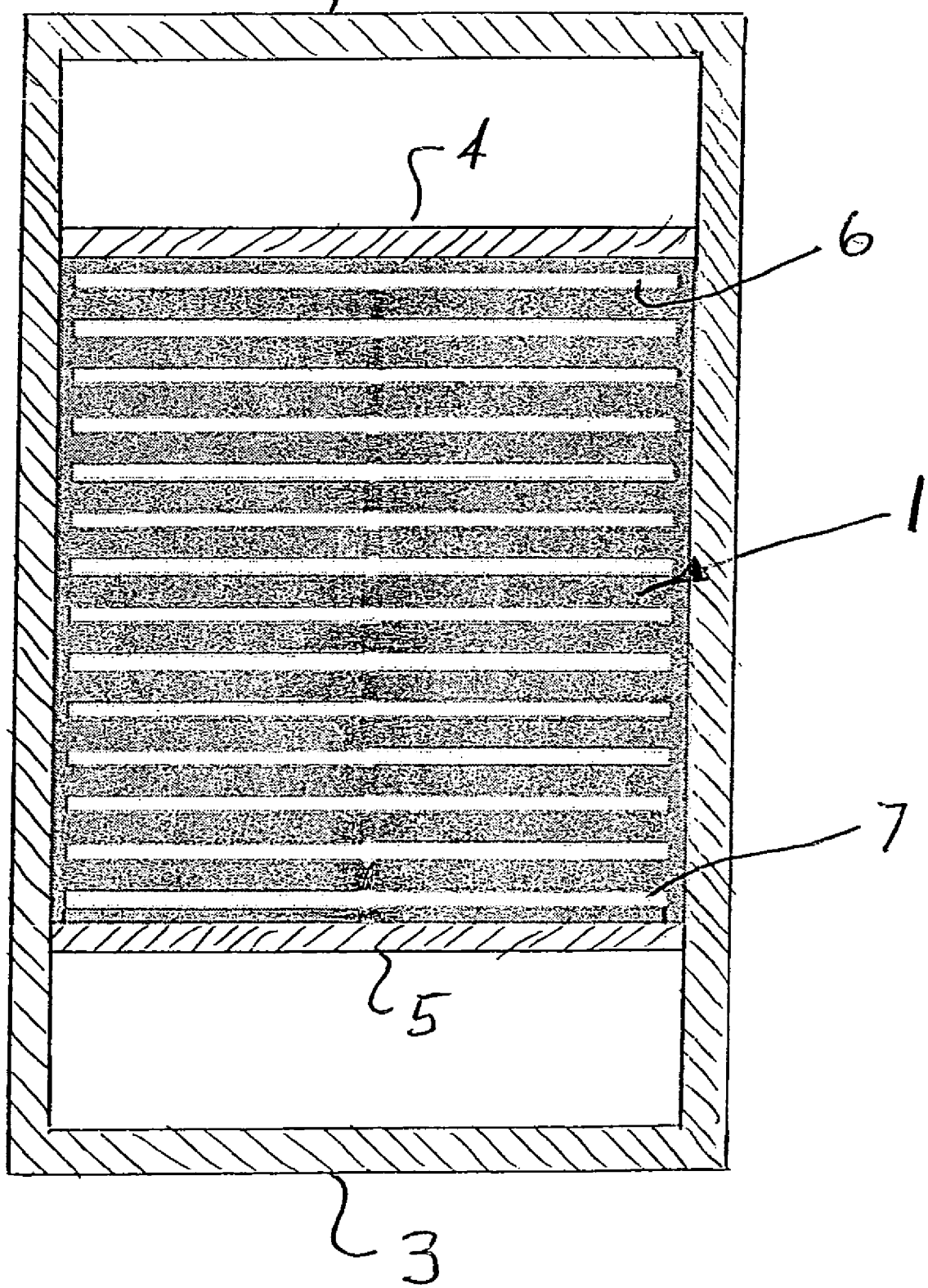
FIG. 14 is a top view of a resonator cavity which has been modified to accommodate a sample holder made according to the present invention.

Consequently, for the two- and three-sample cases, losses are minimized by adjusting the sample spacing b so that the tangential electric field node is centered in each sample. It is found that if the sample is close to the cavity wall, the node is positioned close to the wall and the losses are about four times larger than if the node is in the center of the sample region. In the two-region case, the nodes are centered when each sample is located near y=±X/2, halfway between the center and the walls of the cavity. For the three-sample case, the nodes are centered with uniform cell-to-cell spacing and half-spacing from each end cell to the cavity wall. This condition is found to produce perfectly centered tangential electric field nulls and minimum loss for any number of cells. If it is not possible to extend the sample cells to the cavity wall as prescribed, a metallic sheet oriented in the sample plane can be added on each side of the sample cluster to serve as surrogate cavity walls as shown in FIG. 14. In this example, a sample holder 1 has fourteen channels, or cells, that are equally spaced from one another. The end walls 2 and 3 are spaced much further apart than the sample holder 1 requires, and conductive sheets 4 and 5 have been added to reduce this dimension. As a result, the end cell 6 at one boundary of the series of cells is spaced from the conductive sheet 4 by one-half the spacing between cells, and the end cell 7 at the opposite boundary is spaced from the conductive sheet 5 by one half the cell spacing.

The EPR signal for a reflection microwave bridge employing a linear microwave detector (i.e. sensitive to the microwave voltage rather than the microwave power) can be written $$S=\tfrac{1}{2}\chi\eta Q_0 P_{in}^{1/2}, \qquad (42)$$

where $\chi$ is the RF susceptibility. If the sample cannot be saturated with the available microwave power, $P_{in}$ and $\chi$ are constant and a calculation of the $\eta Q_0$ product permits theoretical comparison. Results of this calculation are shown in FIG. 8(a), varying the sample thickness. The corresponding (unloaded) $Q_0$ values are shown in FIG. 9(a). Examples of samples of this class are $Mn^{2+}$ or $Cu^{2+}$ in aqueous solvent. It can be seen from FIG. 8(a) that the signal strength for the single sample perpendicular orientation at optimum sample thickness drops slightly from the standard nodal plane configuration (dashed line) and that the optimum sample thicknesses are the same. A substantial benefit is obtained by using two- and three-sample regions as indicated, although more total sample is needed to achieve optimum signal strength. From FIG. 9(a) it is apparent that the signal strength increase is accompanied by an increase in $Q_0$.

Referring to Eq. (42), consider the case where the sample can be saturated and the saturation parameter in the denominator of the term $\chi$ becomes important. To compare aqueous cell geometries for this class of samples, $P_{in}^{1/2}$ can be readjusted in all comparisons such that the RF field at the sample remains constant. Thus from an engineering perspective, for non-saturable samples, $P_{in}$ is held constant and for saturable samples, H is held constant. Results of aqueous sample cell calculations are presented in FIG. 8(b). Examples of such samples are spin labels and free radicals in aqueous solvent. Aqueous saturable samples, particularly spin labels, are much more commonly used in EPR spectroscopy than aqueous non-saturable samples.

It is noted from FIG. 8 that the optimum flat cell thickness is larger for saturable than for non-saturable samples. It is apparent also from FIG. 8(b) that the fall off in sensitivity at larger sample thicknesses is very gradual. The gradual fall off may be important for EPR in tissue samples where the sample thickness is difficult to control. This can be compared to the behavior of $Q_0$ shown in FIG. 9(a). These figures may be useful to the EPR instrument designer in situations where it is desirable to trade signal intensity for lower Q-value, e.g.: (i) dominant source phase noise, (ii)

dead time problems in pulse EPR, (iii) ELDOR or other experiments where more than one microwave frequency is incident on the sample, or (iv) resonator sample geometries that are prone to microphonics.

Similarly, FIG. 9(b) shows the peak rotating-frame RF magnetic field at the coordinate origin as a function of sample thickness. This figure provides information to the EPR spectroscopist about whether the sample of interest fits the non-saturable or the saturable condition. It can also be used to set initial conditions for comparison of uniform field resonators with the conventional $TE_{102}$ resonator.

These results can be used to form a theory that predicts the signal strength and $Q_0$ for any number n samples.

Based on the scaling of Eq. (39) and Eqs. (35)–(38) with flat cell sample thickness, $$(\eta Q_0)_1 = \frac{C_1 a}{1 + C_2 a + C_3 a^3}, \qquad (43)$$

where $C_1$, $C_2$, and $C_3$, are constants and a represents the sample thickness. The quantity $C_1 a$ represents the ratio of $\pi f \mu_0$ times the magnetic field energy in the sample to the power loss arising from the cavity walls $P_w$ (plus dielectric end section losses $P_d$ in the case of the $TE_{U02}$ mode), while $C_2 a$ represents the ratio of power loss in the sample due to the normal component of electric field $P_{sEx}$ (type 2 loss, Sec. 3B) to $P_w$ $(+P_d)$, and the quantity $C_3 a$ represents the ratio of power loss in the sample due to the tangential components of electric field (type 1 loss, Sec. 3B) to $P_w$ $(+P_d)$. Note that $C_2$ is zero for the sample oriented in the electric field nodal plane. The optimum sample thickness can be found from Eq. (43) by differentiation, $$a_{1opt} = (2C_3)^{-1/3}. \qquad (44)$$

Consequently, the optimum sample thickness is independent of $C_2$, which implies that it is the same for samples parallel or perpendicular to the electric field nodal plane. This result is consistent with the results of FIG. 8(a). At the optimum sample thickness, $$(\eta Q_0)_{1max} = \frac{C_1 a_{1opt}}{\frac{3}{2} + C_2 a_{1opt}}. \qquad (45)$$

If the sample is divided into n sample regions and it is assumed that the field behaves similarly in each of these regions, we have, based on the scaling properties of each of the constants, $$\eta Q_0 = \frac{n C_1(a'/n)}{1 + n C_2(a'/n) + n C_3(a'/n)^3}, \qquad (46)$$

$$= \frac{C_1 a'}{1 + C_2 a' + (C_3/n^2) a'^3},$$

where a' represents the total sample thickness of the multiple sample region (the sum of the individual sample thicknesses). Comparing Eq. (46) with Eq. (43), the optimum total sample thickness is $$a'_{opt} = n^{2/3} a_{1opt}, \qquad (47)$$

and the signal enhancement ratio for multiple flat cells is, $$\frac{(\eta Q_0)_{nmax}}{(\eta Q_0)_{1max}} = \frac{\frac{3}{2} + C_2 a_{1opt}}{\frac{3}{2} n^{-2/3} + C_2 a_{1opt}}. \qquad (48)$$

It was verified that the predictions of Eqs. (47) and (48) are within 5% of the results of the two- and three-sample region curves shown in FIG. 8. Discrepancies are attributable to non-ideal sample placement with respect to the electric field node in each sample. For the $TE_{102}$ mode and single sample (in perpendicular orientation) in FIGS. 7–9, it was found from the Mathematica calculations that the quantity $C_2 a_{1opt} = 0.257$. With this value, Eq. (48) implies that a factor of 6.85 improvement in signal strength, at most, can be found for a large number of samples (n→∞) separated by thin insulating regions. This result is new. The smaller the quantity $C_2 a_{1op\ t}$, the larger the benefit from breaking up a single flat cell into multiple sample regions. This result is only valid for the case of sample orientation perpendicular to the electric field nodal plane. For standard orientation, there is no benefit to breaking up the flat cell, due to continuity of tangential electric field.

The quantity $C_2 a_{1opt}$, has the form $$C_2 a_{1opt} = \frac{P_{sEx}}{P_w(+P_d)} \qquad (49)$$

$$= \frac{\text{Re}(\omega)\varepsilon_0 \text{Im}(\varepsilon_{rs})}{P_w(+P_d)} \int_{opt\ sample} E_x E_x^* dV \sim \frac{f \text{Im}(\varepsilon_{rs})}{|\varepsilon_{rs}|^2},$$

where $E_x$ represents the component of electric field normal to the sample surface. Consequently, the quantity $C_2 a_{1opt}$ can always be made smaller by decreasing the sample width, $Y_s$, so that more of the sample is near the electric field nodal plane, but this comes at the expense of signal. There can be even greater advantage in using the perpendicular orientation at S-band or L-band, because all three of the quantities f, $\text{Im}(\in_{rs})$, and $|\in_{rs}|$ work to diminish the quantity $C_2 a_{1opt}$ at lower frequencies.

A realistic estimate of the signal enhancement from multiple flat cells at X-band was made by limiting the number of samples based on the use of reasonably machinable thicknesses and by limiting the size of the stack of flat cells to fill only a fraction $a'_{opt}/X$ of the cavity dimension X, which, when combined with Eq. (47) gives $$n_{max} \cong (a'_{opt}/a_{1opt})^{3/2}, \qquad (50)$$

where now $a'_{opt}$ is chosen to fill some fraction of X. The fraction $a'_{opt}/X$ should be limited to about 0.5, based on observations of the electric field nulls inside the sample regions for the two- and three-sample configurations. The closer the samples are placed to a vacuum electric field null, whether due to symmetry or due to the conducting wall, the closer the sample null becomes to the vacuum null. The conducting wall null seems to draw the sample null toward it, although never out of the sample. In the limit where the sample null is on the sample boundary (which occurs for a sample on the cavity wall), the type 1 loss is quadruple that of a sample-centered null.

The signal strength for multiple samples was calculated based on Eqs. (45), (47), (48) and (50). This signal strength was calculated as a function of sample width $Y_s$, for cavity fill fractions $a'_{opt}/X$ of 0.2, 0.4, and 0.6. Signal strength was generally slowly varying with sample width, but in all cases a peak was evident. Results corresponding to the peak signal are shown in Table 1.

TABLE 1

$TE_{102}$ optimum multiple flat cell properties.

| total sample thickness $a'_{opt}$[cm] (= $a'_{opt}$/X) | sample width $Y_s$[cm] | sample number n | individual sample thickness $a'_{opt}$/n [mil] | signal strength $(\eta Q_0)_{n\,max}$ | signal ratio over standard orientation $\dfrac{(\eta Q_0)_{n\,max}}{(\eta Q_0)_{1\text{Enodal plane}}}$ | $Q_0$ |
|---|---|---|---|---|---|---|
| non-saturable | | | | | | |
| 0.6 | 0.55 | 73 | 3.3 | 266 | 6.3 | 3150 |
| 0.4 | 0.60 | 41 | 3.9 | 213 | 5.0 | 3400 |
| 0.2 | 0.85 | 17 | 4.7 | 144 | 3.4 | 3100 |
| Saturable | | | | | | |
| 0.6 | 0.80 | 27 | 8.8 | 120 | 6.0 | 1000 |
| 0.5 | 0.82 | 19 | 9.2 | 109 | 5.5 | 1000 |
| 0.4 | 0.90 | 15 | 10.0 | 94 | 4.7 | 1000 |

For the saturable case, the signal strengths should read $\eta Q_0 P_{in}^{1/2}$.

Note that a factor of 6.3 larger signal strength over standard orientation is obtained with many samples and a smaller sample width. One must be very clever, however, to create a sample holder that can house 73 sample layers in 0.6 cm. If fewer samples are used, the optimum samples become slightly thicker and wider, with a factor of two sacrifice in signal strength at n=17. Also shown in Table 1 is the $Q_0$ corresponding to the signal strength. The $Q_0$ values for multiple flat cells were found by following a similar argument to that used in finding $\eta Q_0$. The $Q_0$ at optimum multiple flat cell thickness, $a'_{opt}$, $(Q_0)_{n\,max}$, is related to the unloaded cavity $Q_0$ with no sample, $Q_{0u}$, by Eq. (51):

$$(Q_0)_{n\max} = \frac{Q_{0u}}{\frac{3}{2} + C_2 a_{1opt} n^{2/3}} \tag{51}$$

In all cases, the $(Q_0)_{n\,max}$ is about ⅓ the unloaded cavity $Q_{0u}$, which is 8980.

The analysis of the previous section can be repeated for saturable samples. For the saturable case, $$(\eta Q_0 P_{in}^{1/2})_1 = \frac{C_1 a}{\sqrt{1 + C_2 a + C_3 a^3}}, \tag{52}$$

where the same symbol definitions apply as in the non-saturable case. Here, the optimum sample thickness, found from Eq. (52) by differentiation, is the only real root of the cubic equation $$2 + C_2 a_{1opt} - C_3 a_{1opt}^3 = 0. \tag{53}$$

The analytic solution to this equation was found and evaluated by Mathematica and is the analog to Eq. (44). Extending these results to n sample regions, it was found that $$(\eta Q_0 P_{in}^{1/2})_{n\max} = \frac{C_1 a'_{opt}}{\sqrt{1 + C_2 a'_{opt} + (C_3/n^2) a'^3_{opt}}}, \tag{54}$$

where the optimum total sample thickness $a'_{opt}$ is found from $$2 + C_2 a'_{opt} - \frac{C_3}{n^2} a'^3_{opt} = 0, \tag{55}$$

and the constants $C_2$ and $C_3$ are found from the single sample power loss calculations. The signal enhancement ratio for multiple flat cells is $$\frac{(\eta Q_0 P_{in}^{1/2})_{n\max}}{(\eta Q_0 P_{in}^{1/2})_{1\max}} = \frac{a'_{opt}}{a_{1opt}} \sqrt{\frac{1 + C_2 a_{1opt} + C_3 a_{1opt}^3}{1 + C_2 a'_{opt} + C_3 a'^3_{opt}/n^2}}, \tag{56}$$

while the corresponding $Q_0$ value is given by $$(Q_0)_{n\max} = \frac{Q_{0u}}{1 + C_2 a'_{opt} + C_3 a'^3_{opt}/n^2}. \tag{57}$$

Sample widths were again limited by the cavity dimension X, and the signal strength was scanned as a function of sample width. It was found that the signal strength continued to increase slowly with sample width, unlike the non-saturable case. Consequently, the numerical results shown in Table 1 are limited not by peak signal strength, but by limiting $Q_0$ to a practical bridge-limited maximum value of 1000 (loaded Q 500). It can be seen that the enhancement ratios over the standard orientation are comparable to the non-saturable case, whereas the sample thicknesses are about 2½ times larger and fewer samples are required. Sample widths are about double that of the non-saturable case.

The change in resonant frequency of the cavity due to the relatively large amount of sample required to produce the signal enhancement discussed in Sec. D can be estimated from $$\frac{f - f_0}{f} = \frac{-\int_{V_0} (\varepsilon - \varepsilon_0) E \cdot E_0^* dV}{\int_{V_0} \varepsilon_0 E \cdot E_0^* dV} \quad (58)$$

This is an exact expression, which was derived by considering the frequency and fields in an enclosed conducting reference cavity of volume $V_0$ and dielectric (subscript 0) and new frequency and fields in the presence of a new dielectric region $\in$ inside the cavity (no subscript). When the dielectric constant is complex, the frequency shift predicted by Eq. (58) is complex.

In general, the real and imaginary parts of the frequency are related to the cavity Q by $$Q_0 = \frac{\text{Re}(f)}{2\text{Im}(f)}. \quad (59)$$

Now consider a standard sample oriented in the electric field nodal plane. When the sample is very thin, the electric field inside the sample $E = E_0$, the electric field without the sample present, due to continuity of the tangential electric field across the sample interface. Therefore, Eq. (58) may be used to relate the ratio of real and imaginary parts of the frequency shift to real and imaginary parts of the sample relative dielectric constant, $$\left(\frac{\text{Re}(f_0 - f)}{\text{Im}(f)}\right)_{parallel} = \frac{\text{Re}(\varepsilon_{rs} - 1)}{\text{Im}(\varepsilon_{rs} - 1)}. \quad (60)$$

For water at 9.5 GHz, this equation predicts a ratio of 1.818. This value was confirmed by the analytic model (Appendix A). As the sample thickness increases, this ratio decreases to about 1.77 at optimum sample thickness due to the electric field phase change through the sample (see Eq. 58). In combining this result with Eq. (59) and factoring out wall losses, we predict a real frequency shift (due to sample alone) of about 1.77(9.5 GHz)/2/[9000/(3/2−1)]≅0.47 MHz. The quartz sample holder has a much larger effect. This number has been confirmed using the analytic model as well as experimentally.

For the perpendicular orientation when the sample is very thin, the electric field in the sample is primarily normal to the sample surface plane. Continuity of normal displacement across the sample interface predicts an electric field in the sample $E = E_0/\varepsilon_{rs}$. Substituting this into Eq. (58) gives $$\left(\frac{\text{Re}(f_0 - f)}{\text{Im}(f)}\right)_{perpendicular} = \frac{\text{Re}(1 - 1/\varepsilon_{rs})}{\text{Im}(1 - 1/\varepsilon_{rs})}. \quad (61)$$

For water at 9.5 GHz, this equation predicts a ratio of 129.2, which also holds for multiple samples. This value was confirmed by the analytic model for one-, two- and three-sample regions for sample extending fully across the cavity Y dimension. As the sample thickness increases, this ratio decreases to 60 (one sample), 87 (two samples), and 107 (three samples) at optimum sample thickness. The decrease is due to a combination of the phase change of the electric field through the samples and the presence of the electric field component tangential to the sample surface (see Eq. (58)). These effects are more pronounced when the sample is limited in the cavity Y dimension, $Y_s < Y$, because more of the sample lies near the electric field nodal plane. Consequently, the ratio is smaller for limited sample, $Y_s < Y$.

These results may be used to predict an upper limit on the real frequency shift due to a large number of samples. Using the results of Table 1, we estimate a frequency shift due to sample alone for the non-saturable n=73 case to be 129(9.5 GHz)/2/[9000/(9000/3150−1)]≅126 MHz. For saturable cases, we obtain a shift of 545 MHz. For reasons outlined above, this frequency shift is likely to be reduced by more than 50% due to the thicker sample regions and for limited sample. Nevertheless, this shift is within the usual 10% tuning range of X-band EPR bridges.

The multiple sample analysis carries over to the U02 mode without modification. Therefore, the signal enhancement due to multiple samples is similar for the U02 mode. It was found that the quantity $C_2 a_{1_{opt}}$ was about 5% larger for the $TE_{U02}$ of the same cavity L, X, and sample size, than the $TE_{102}$. This is caused by the more rapid electric field increase away from the electric field nodal plane caused by the smaller cavity dimension Y=c/f. The larger $C_2 a_{1_{opt}}$ implies a marginally smaller U02 signal enhancement factor for multiple flat cells. More significantly, the RF magnetic field has a narrower sinusoidal peak at the cavity center also caused by the smaller Y. This produces a smaller signal strength. The ratio of sample magnetic field for the U02 to the 102 due to this effect is given by $$\frac{\left(\int_{sample} H \cdot H^* dV\right)_{U02}}{\left(\int_{sample} H \cdot H^* dV\right)_{102}} = \frac{1 + \frac{\sin(2\pi Y_s/Y)}{2\pi Y_s/Y}}{1 + \frac{\sin(2\pi Y_s/Y_{102})}{2\pi Y_s/Y_{102}}}. \quad (62)$$

This quantity varies from 0.95 at $Y_s=0.55$ cm to 0.86 at $Y_s=1.0$ cm. The combined effects reduce the signal for the U02 mode for the single sample in perpendicular orientation to about 89% of its value for the 102 mode for $Y_s=1.0$ cm. This is true even though the signal in standard orientation is 10% higher for the U02 than for the 102. The signal reduction is less severe for smaller sample widths. This effect is manifest in a drop in signal strength between the sample in standard versus perpendicular orientation. This can be more than overcome by using more sample along the uniform field dimension.

Qualitatively, sensitivity benefits of the UF mode over the cosine mode arise from the following factors: (i) the dimension Y is 1.5 times smaller than in the standard cavity, improving the filling factor; (ii) the flat cell thickness is optimum at every point along L; and (iii) the area over which the electric field is zero, the XL product, is unrestricted.

An analytic solution of the Maxwell equations for aqueous flat cells in rectangular cavities has led to the prediction of a factor of 3–5 times X-band EPR signal enhancement for an assembly of many flat cells oriented perpendicular to the electric field nodal plane. Greater enhancement is expected at lower operating frequencies. Observation of the predicted fields led to classification of three distinct types of sample loss mechanisms, which led to sample designs that minimized each loss type. The resulting EPR signal enhancement is due to the presence and centering of a tangential electric field node within each individual sample region. These observations carry over to uniform field mode resonators. Based on this analysis, a practical multiple flat cell design is proposed consisting of a large number of thin sample regions separated by insulating septa. The sample regions should be uniformly spaced from each other with half-spacing between each end cell and the cavity wall. The thickness of each cell depends on the sample number and whether the sample is saturable or non-saturable. Resonant frequency shift due to the presence of the relatively large amount of required sample was also analyzed and is manageable.

Appendix A. Cases 1 and 2

For the standard orientation with the sample in the electric field nodal plane, a TM mode transverse to x is found, and the corresponding transverse scalar wave functions in the central and end sections can be written, respectively, as $$\psi_c = E_{xc} = \frac{-i\omega\mu_0 H_0}{\eta}(A\sin\eta y - B\cos\eta y)\cos k_1 z, \quad (A1)$$

$$\psi_e = E_{xe} = \frac{-i\omega\mu_0 H_0}{\eta}\frac{\cos(k_1 L/2)}{\sin k_2 d}(A\sin\eta y - B\cos\eta y)\sin[k_2(L/2 + d - z)]. \quad (A2)$$

Here, the same variable definitions apply, while A and B are constants that are determined by the boundary conditions in y. The transverse wavenumber $\eta$ takes on two different values inside ($\eta_2$) and outside ($\eta_1$) the sample. The wave functions have already been matched across the dielectric interface between central and end sections at $z=L/2$. The fields can be derived from these wave functions through Eqs. (4) and (5) in the limits $\eta \to 0$, $A \to 0$ and $B \to 1$. The latter two conditions must be applied to Eq. (5), since the constants A and B for the present orientation have already been incorporated into Eqs. (A1) and (A2).

Accordingly, the explicit expressions for the other field components in the central and end sections, respectively, are $$H_{yc} = \frac{H_0 k_1}{\eta}(A\sin\eta y - B\cos\eta y)\sin k_1 z, \quad (A3)$$

$$H_{ye} = \frac{H_0 k_2}{\eta}\frac{\cos(k_1 L/2)}{\sin k_2 d}(A\sin\eta y - B\cos\eta y)\cos[k_2(L/2 + d - z)]. \quad (A4)$$

$$H_{zc} = H_0(A\cos\eta y + B\sin\eta y)\cos k_1 z, \quad (A5)$$

$$H_{ze} = H0\frac{\cos(k_1 L/2)}{\sin k_2 d}(A\cos\eta y + B\sin\eta y)\sin[k_2(L/2 + d - z)], \quad (A6)$$

In imposing continuity of a $\partial\psi/\partial z|_{z=L/2}$, an interface equation relating the axial wavenumbers $k_1$ and $k_2$ is obtained, $$k_1 \tan k_1 L/2 = k_2 \cot k_2 d. \quad (A7)$$

If the sample is $0<y<a$ (viz. region 2) and free space $a<y<Y/2$ (region 1), for the RF magnetic field amplitude at the coordinate origin to be $H_0$, the amplitude constants $$A_2=1, \quad (A8)$$

$$B_2=0. \quad (A9)$$

Imposing continuity of $\psi$ across $y=a$ and the conductive boundary condition $\psi|_{y=Y/2}=0$, it can be found that $$A_1=\cos\eta_2 a \cos\eta_1 Y/2/\cos[\eta_1(Y/2-a)], \quad (A10)$$

$$B_1=\cos\eta_2 a \sin\eta_1 Y/2/\cos[\eta_1(Y/2-a)], \quad (A11)$$

In imposing continuity of $\partial\psi/\partial y|_{y=a}$, the sample interface equation relating the transverse wavenumbers $\eta_1$ and $\eta_2$, is obtained $$\eta_2 \cot\eta_2 a = -\eta_1 \cot\eta_1(Y/2-a). \quad (A12)$$

The system of five equations and five unknowns is formed by Eq. (A7), (A12), and completed with a dispersion relation for each of the three different dielectric regions, $$\omega^2/c^2 = \eta_1^2 + k_1^2, \quad (A13)$$

$$= (\eta_1^2 + k_2^2)/\varepsilon_{re}, \quad (A14)$$

$$= (\eta_2^2 + k_1^2)/\varepsilon_{rs}, \quad (A15)$$

where the subscript r refers to the relative dielectric constant, the subscript e refers to the dielectric end and s refers to the sample. The end section dielectric thickness d required to produce a uniform field in the central section can be found by solving the system of equations with $k_1=0$ and solving for d. The corresponding thickness without sample can be found by setting $k_1=0$ in Eqs. (A7), (A13), and (A14), yielding $$d = \frac{c}{4f\sqrt{\varepsilon_{re}-1}}. \quad (A16)$$

The system of equations for the $TE_{102}$ mode is obtained from these by eliminating Eqs. (A7) and (A14) from the system, setting $k_1=\pi/L$, and ignoring the fields in the end section. Then $k_2$ becomes arbitrary, and, in the limit of zero sample thickness, $Y=(f^2/c^2-1/4L^2)^{-1/2}$.

Appendix B: Field Expressions for Sample Perpendicular to Electric Field Nodal Plane.

Field expressions below are written in terms of the amplitude constants A and B, and the mode constants $\omega$, $\gamma$, $k_1$, and $k_2$ ($\eta$ is given by Eq. (3)). In general, the fields and the constants A and B take on the subscripts corresponding to the dielectric region number, starting in the outer region. It is intended to follow the free space x-wavenumber $\gamma_1$ into the end sections, but not to consider the presence of the sample in the end section. Thus, the variable $\gamma$ takes on the subscript 2 in the sample region(s) in the central section only, and takes on the subscript 1 everywhere else. The field solutions in the end sections over the x-coordinates that are occupied by sample in the central section are ignored. The applicable system of equations to solve, which yield the values of the "unknown" mode constants $\omega$, $\gamma_1$, $\gamma_2$, $(X_2, X_3)$, $k_1$, $k_2$ as well as the expressions for the amplitude constants A and B, are indicated in the respective subsections below.

$$E_{xc} = \frac{-iH_0(\eta^2+k_1^2)}{\omega\varepsilon\eta}(A\cos\gamma x + B\sin\gamma x)\sin\eta y \cos k_1 z, \quad (B1)$$

-continued $$E_{xe} = \frac{-iH_0(\eta^2 + k_2^2)}{\omega\varepsilon\eta}\frac{\cos(k_1L/2)}{\sin k_2 d}(A\cos\gamma x + B\sin\gamma x)\sin\eta y \sin[k_2(L/2 + d - z)],$$ (B2)

$$E_{yc} = \frac{iH_0\gamma}{\omega\varepsilon}(A\sin\gamma x - B\cos\gamma x)\cos\eta y\cos k_1 z,$$ (B3)

$$E_{ye} = \frac{iH_0\gamma}{\omega\varepsilon}\frac{\cos(k_1L/2)}{\sin k_2 d}(A\sin\gamma x - B\cos\gamma x)\cos\eta y\sin[k_2(L/2 + d - z)],$$ (B4)

$$E_{zc} = \frac{-iH_0\gamma k_1}{\omega\varepsilon\eta}(A\sin\gamma x - B\cos\gamma x)\sin\eta y\sin k_1 z,$$ (B5)

$$E_{ze} = \frac{-iH_0\gamma k_2}{\omega\varepsilon\eta}\frac{\cos(k_1L/2)}{\sin k_2 d}(A\sin\gamma x - B\cos\gamma x)\sin\eta y\cos[k_2(L/2 + d - z)],$$ (B6)

$$H_{yc} = \frac{H_0 k_1}{\eta}(A\cos\gamma x + B\sin\gamma x)\sin\eta y\sin k_1 z,$$ (B7)

$$H_{ye} = \frac{H_0 k_2}{\eta}\frac{\cos(k_1L/2)}{\sin k_2 d}(A\cos\gamma x + B\sin\gamma x)\sin\eta y\cos[k_2(L/2 + d - z)],$$ (B8)

$$H_{zc} = H_0(A\cos\gamma x + B\sin\gamma x)\cos\eta y\cos k_1 z,$$ (B9)

$$H_{ze} = H0\frac{\cos(k_1L/2)}{\sin k_2 d}(A\cos\gamma x + B\sin\gamma x)\cos\eta y\sin[k_2(L/2 + d - z)],$$ (B10)

1. One-sample Equations.

Taking free space $a<x<X/2$ (region 1), and sample $0<x<a$ (region 2), the system of equations for the mode constants $\omega$, $\gamma_1$, $\gamma_2$, $k_1$, $k_2$, is given by Eqs. (14), (16)–(19) and the amplitude constants are given by $A_2=1$, (B11)

$B_2=0$, (B12)

$A_1 = \cos\gamma_1 X/2 \cos\gamma_2 a/\cos[\gamma_1(X/2-a)]$, (B13)

$B_1 = A_1 \tan\gamma_1 X/2$. (B14)

2. Two-sample Equations.

Taking the outer free space region $a+b<x<X/2$ (region 1), the sample $b<x<a+b$ (region 2), and the inner free space region $0<x<b$ (region 3), the system of equations for the mode constants $\omega$, $\gamma_1$, $\gamma_2$, $X_2$, $k_1$, $k_2$, is given by Eqs. (25), (26) and (16)–(19), and the amplitude constants are given by $A_3=1$, (B15)

$B_3=0$, (B16)

$A_2 = \cos\gamma_2 X_2/2 \cos\gamma_1 b/\cos[\gamma_2(X_2/2-b)]$, (B17)

$B_2 = A_2 \tan\gamma_2 X_2/2$, (B18)

$A_1 = A_2 \cos\gamma_1 X/2 \cos[\gamma_2(X_2/2-a-b)]/\cos\gamma_2 X_2/2/\cos[\gamma_1(X/2-a-b)]$, (B19)

$B_1 = A_1 \tan\gamma_1 X/2$. (B20)

3. Three-sample Equations.

Taking the outer free space region $a+b<x<X/2$ (region 1), the outer sample region $b<x<a+b$ (region 2), the inner free space region $a/2<x<b$ (region 3), and the inner sample region $0<x<a/2$ (region 4), the system of equations for the mode constants $\omega$, $\gamma_1$, $\gamma_2$, $X_2$, $X_3$, $k_1$, $k_2$, is given by $$\gamma_1\tan[\gamma_1(X_3/2-a/2)] = -\frac{\gamma_2}{\varepsilon_{rs}}\tan\gamma_2 a/2,$$ (B21)

$$\gamma_1\tan[\gamma_1(X_3/2-b)] = \frac{\gamma_2}{\varepsilon_{rs}}\tan[\gamma_2(X_2/2-b)],$$ (B22)

$$\gamma_1\tan[\gamma_1(X/2-a-b)] = \frac{\gamma_2}{\varepsilon_{rs}}\tan[\gamma_2(X_2/2-a-b)],$$ (B23)

with Eqs. (16)–(19) and the amplitude constants are given by $A_4=1$, (B24)

$B_4=0$, (B25)

$A_3 = \cos\gamma_1 X_3/2 \cos\gamma_2 a/2/\cos[\gamma_1(X_3/2-a/2)]$, (B26)

$B_3 = A_3 \tan\gamma_1 X_3/2$, (B27)

$A_2 = A_3 \cos\gamma_2 X_2/2 \cos[\gamma_1(X_3/2-b)]/\cos\gamma_1 X_3/2/\cos[\gamma_2(X_2/2-b)]$, (B28)

$B_2 = A_2 \tan\gamma_2 X_2/2$. (B29)

$A_1 = A_2 \cos\gamma_1 X/2 \cos[\gamma_2(X_2/2-a-b)]/\cos\gamma_2 X_2/2/\cos[\gamma_1(X/2-a-b)]$, (B30)

$B_1 = A_1 \tan\gamma_1 X/2$. (B31)

Appendix C: Analytic Expression for Integral $P_s$.

Evaluation of Eq. (38) using Eqs. (B1), (B3) and (B5) with the limited sample model discussed in Sec. 2C yields $P_s = P_{sg}(\alpha \to 0, \beta \to a, \gamma \to \gamma_2, A \to A_2, B \to B_2)$, (C1)

for the one-sample configuration, $P_s = P_{sg}(\alpha \to b, \beta \to a+b, \gamma \to \gamma_2, A \to A_2, B \to B_2)$, (C2)

for the two-sample configuration, and $P_s = P_{sg}(\alpha \to 0, \beta \to a/2, \gamma \to \gamma_2, A \to A_4, B \to B_4) +$ (C3)
$P_{sg}(\alpha \to b, \beta \to a+b, \gamma \to \gamma_2, A \to A_2, B \to B_2),$ for the three-sample configuration, where $$P_{sg} = H_0^2 \mathrm{Re}(\omega)\mathrm{Im}(\varepsilon_{rs})/(16\omega\omega^*\varepsilon_s\varepsilon_s^*)\{(\eta^2+k_1^2)$$ (C4)

$(1 + k_1^{2*}/\eta^2)I_{AB2}I_Y[\sinh(k_{1i}L)/k_{1i} +$ $\sin(k_{1r}L)/k_{1r}] + (Y_s + \sin(\eta Y_s)/\eta)\gamma_2\gamma_2^* I_{AB1}[\sinh(k_{1i}L)/$ $k_{1i} + \sin(k_{1r}L)/k_{1r}] + (Y_s - \sin(\eta Y_s)/\eta)\gamma_2\gamma_2^*(k_1 k_1^*/\eta^2)$ $I_{AB1}[\sinh(k_{1i}L)/k_{1i} - \sin(k_{1r}L)/k_{1r}]\},$ and where $$I_{AB1} = (1/\gamma_i)[\sinh(2\gamma_i\beta) - \sinh(2\gamma_i\alpha)](AA^* + BB^*) - \qquad (C5)$$
$$(1/\gamma_r)[\sin(2\gamma_r\beta) - \sin(2\gamma_r\alpha)](AA^* - BB^*) +$$
$$(i/\gamma_i)[\cosh(2\gamma_i\beta) - \cosh(2\gamma_i\alpha)](A^*B - AB^*) +$$
$$(1/\gamma_r)[\cos(2\gamma_r\beta) - \cos(2\gamma_r\alpha)](A^*B + AB^*),$$

$$I_{AB2} = (1/\gamma_i)[\sinh(2\gamma_i\beta) - \sinh(2\gamma_i\alpha)](AA^* + BB^*) + \qquad (C6)$$
$$(1/\gamma_r)[\sin(2\gamma_r\beta) - \sin(2\gamma_r\alpha)](AA^* - BB^*) +$$
$$(i/\gamma_i)[\cosh(2\gamma_i\beta) - \cosh(2\gamma_i\alpha)](A^*B - AB^*) -$$
$$(1/\gamma_r)[\cos(2\gamma_r\beta) - \cos(2\gamma_r\alpha)](A^*B + AB^*),$$

$$I_Y = 4\int_0^{Y_s/2} dy \sin^2(\eta y)(1 + C_E e^{-(Y_s/2-y)/a})^2, \qquad (C7)$$

while the subscripts i and r on the wavenumbers designate imaginary and real parts, respectively. Note that $I_Y$ was evaluated analytically in closed form (using Mathematica); the explicit expression is lengthy. In addition, $\eta$ is real and given by Eq. (3).

DETAILED DESCRIPTION OF THE PREFERRED EMBODIMENT

Referring particularly to FIG. 1, the microwave bridge of an EPR spectrometer system includes an oscillator 10 which produces radio frequency (RF) power at the desired frequency. Klystrons are typically used to produce over 200 mW of power at a frequency in the 9 to 10 GHz range. The RF power produced by oscillator 10 is conveyed through a waveguide 12, attenuator 14, and microwave circulator 16 to a resonator 18 containing a sample to be tested. An adjustable iris 20 connects the sample resonator 18 to waveguide segment 22 and is used to match the impedances of these two elements.

Samples subjected to RF energy in the resonator 18 produce responsive signals which are conveyed to a detector crystal 24 through the circulator 16 and a waveguide segment 26. A reference signal is also applied to the detector crystal 24 by a reference arm 28. The reference arm 28 includes a directional coupler 30 which diverts RF power from the waveguide segment 12 and couples that RF power, suitably attenuated, phase shifted and delayed, to the detector crystal 24 through a second directional coupler 32. Signal attenuator 34, phase shifter 36 and delay line 38 provide precise control over the reference RF power. Not shown in FIG. 1 is a magnet which produces a strong polarizing magnetic field that establishes the frequency of the measurement to be performed.

The present invention pertains to the placement of samples to be tested in the resonator 18. The resonator 18 can take many forms depending on the test being performed, the instrument being used and the frequency of the test. These include rectangular and cylindrical cavity resonators, rectangular and cylindrical uniform field (UF) resonators, and loop-gap resonators (LGR) as referred to above.

Figure 10A:
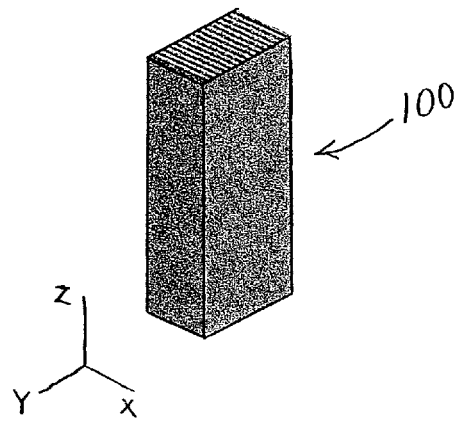
FIGS. 10A and 10B are a perspective view and top view respectively of a first preferred embodiment of a sample holder according to the present invention.
Figure 10B:
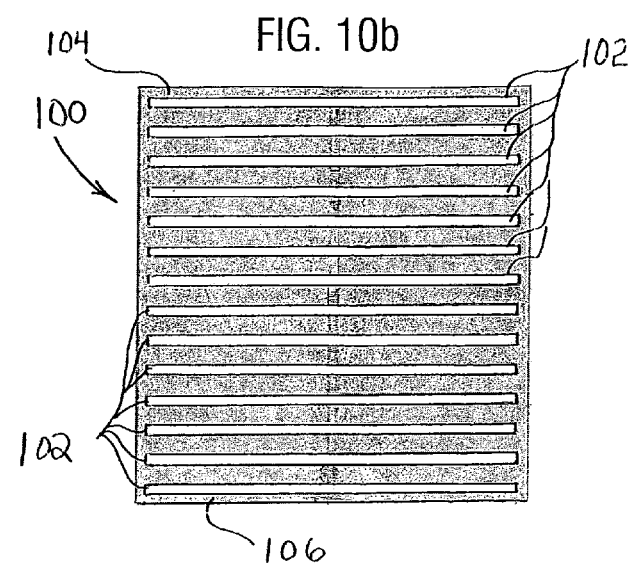

Referring particularly to FIGS. 10A and 10B, a first embodiment of a sample holder 100 in accordance with the teaching of the present invention is a rectangular structure for use in a rectangular cavity resonator operated at 9.5 Hz (x-band) in the $TE_{102}$ mode. This first embodiment may also be used in a rectangular, uniform field cavity resonator $T_{U02}$.

The sample holder 100 is formed from a porous material having a low dielectric constant and it is sized to fit the rectangular cavity in which it is used. Cells for containing sample material are formed by fourteen channels 102 in the form of thin slots that extend through the entire lengthwise dimension Z of the sample holder 100 and extend nearly across its entire thickness dimension X. Each channel 102 has a cross-section of 9 mm by 0.254 mm and they are equally spaced apart in parallel planes along the entire width dimension Y. The channels 102 are equally spaced from each other by 0.474 mm, but the spacing between the channels 12 at each end and the adjacent resonator cavity wall is one-half this distance.

In this embodiment the electric field E is directed solely along the y-axis. Because each channel 12 is very thin along the y-axis a vast majority of the sample boundary lies in planes oriented perpendicular to this field E. A ratio of greater than 10 to 1 in the channel cross-sectional width to the thickness has been found to provide significant signal enhancement.

The channels 102 are filled with the sample to be tested and the sample holder 100 is placed in the resonator 18. Tests have demonstrated that this structure results in an EPR signal from the sample that is from 12.7 to 19.7 times the EPR signal produced by a conventional tube sample and 3.1 to 4.8 times the EPR signal produced by a flat sample oriented at the central nodal plane. These results are for a sample holder dielectric constant close to unity. A significant factor which determines the gain in signal strength is the dielectric constant of the sample holder material. The lower the dielectric constant the better. For PTFE sample holder, EPR signals are reduced by about 50% from the above values.

Figure 11A:
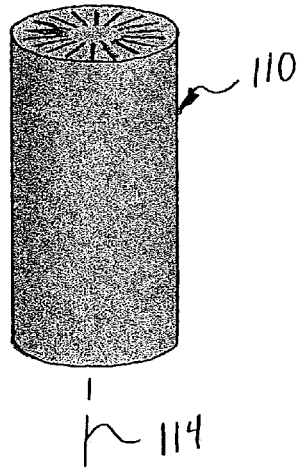
FIGS. 11A and 11B are a perspective view and top view respectively of a second preferred embodiment of a sample holder according to the present invention.
Figure 11B:
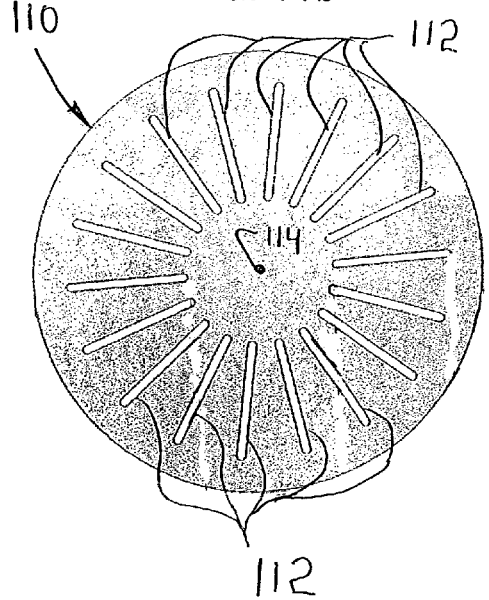

Synthetic polymers (i.e., plastics) have a dielectric constant around 2 and air has a dielectric constant of 1. The preferred material is a polytetrafluoroethylene foam which is extruded through a die and then cut to the desired length. The die through which the material is extruded is shaped to form the desired outer dimensions and shape of the sample holder body as well as the channels formed therein. A skin forms on the surfaces during extrusion, but microscopic pores are formed in the structure to lower the dielectric constant of the material. Such material is available from Zeus Industrial Products, Inc. of Orangeburg, S.C. under the trade name "ePTFE". Referring particularly to FIGS. 11a and 11B, a second preferred embodiment of the sample holder is for use in a cylindrical shaped cavity resonator operated in the $TE_{011}$ mode. It will also operate with a cylindrical uniform field cavity resonator $TE_{01U}$. The sample holder 110 is extruded in a circular cylindrical shape from a porous polymer and it is cut to the length of the cavity resonator in which it is used. A total of eighteen, slot-like channels 112 are formed along the entire length of the sample holder 110. The channels 112 are radially directed and equally spaced around a central axis 114 of the sample holder 110. Each channel 112 has a cross-section of 0.2 mm by 2.7 mm and the diameter of the sample holder 110 is 10 mm.

In this embodiment the electric field E circles around the central axis 114 and the planes defined by the boundary of each channel 112 are substantially perpendicular to this field. Subject to manufacturing limitations, the channels 112 can be further extended radially inward and their cross-sectional shape can be changed to a wedge shape to increase the amount of sample and better align their boundaries. Tests have demonstrated that this embodiment of the invention results in an EPR signal from the sample that is from 9.5 to 12.4 times greater than the EPR signal produced with a conventional tube sample. When used in a comparable uniform field resonator this gain in signal strength is not quite as large, but the difference can be made up by extending the length of the resonator by approximately ten percent.

Figure 12:
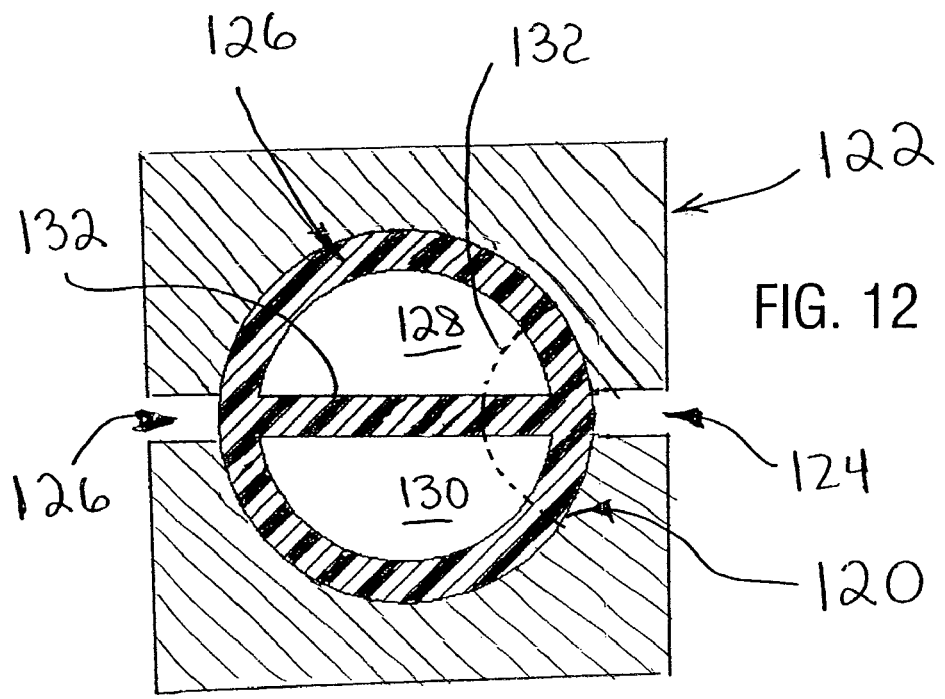
FIG. 12 is a view in cross-section through a loop-gap resonator and a third preferred embodiment of the invention.

Referring particularly to FIG. 12, a third embodiment of a sample holder 120 is shown in a loop-gap resonator 122 having two gaps 124 and 126. The sample holder 120 is an extruded body having a circular cylindrical outer wall 129 which is sized to fit within the circular cylindrical central cavity of the loop gap resonator 122. The interior of the sample holder 120 is divided into two channels 128 and 130 by a web 132 that is formed during extrusion and that extends across its interior. The channels 128 and 130 each have a semi-circular cross-section and the web 132 is aligned with the plane defined by the two gaps 124 and 126. As indicated by dotted line 132, the electric field E in this resonator is perpendicular to the resonator cylindrical wall and it is perpendicular to the plane defined by the two gaps 124 and 126. As a result, the electric field E is also substantially perpendicular to the semi-circular boundary of each channel 128 and 130 as well as their planar boundaries formed by the web 132.

Tests have demonstrated that this embodiment of the invention results in an EPR signal from the sample in channels 128 and 130 that is from 1.1 to 1.5 times greater using the PTFE sample holder than the EPR signal produced with a conventional tube sample.

Figure 13:
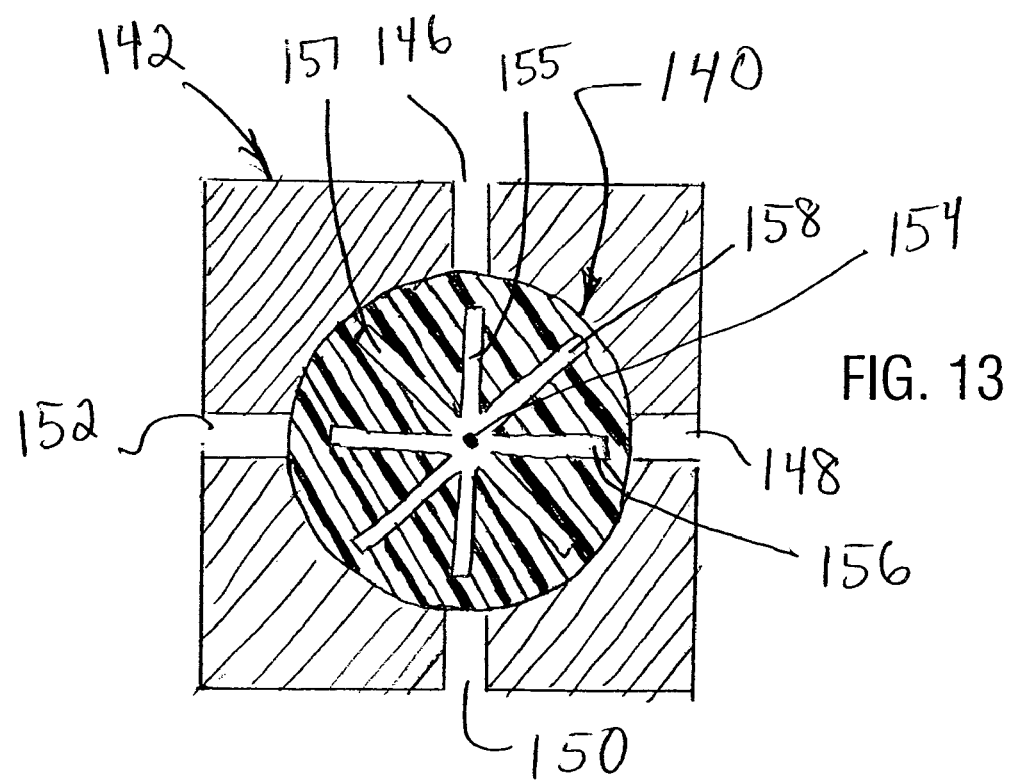
FIG. 13 is a view in cross-section through a loop-gap resonator and a fourth preferred embodiment of the invention.

Referring particularly to FIG. 13, the preferred sample holder 140 used with a loop-gap resonator 142 having four gaps 146, 148, 150 and 152 is a very different structure from the two-gap embodiment. The sample holder 140 is an extruded cylindrical structure which is sized to fit within the circular cylindrical central cavity of the loop-gap resonator 142. A set of four radially directed channels 155–158 passing through the central axis 154 of the structure are formed in the extruded sample holder 140. Two of these channels 155 and 156 are aligned with and extend between respective resonator gaps 146/150 and 148/152 to form a "cross" in cross-section. The other two channels 157 and 158 are rotated 45° from the planes of the gaps 146/150 and 148/152 to form an "X" in cross-section. All of the channels 155–158 have the same thickness of 0.008 inches, and the width of the X channels 157 and 158 is maximized to 0.122 inches. The width of the channels 155 and 156 aligned with the gaps 146/150 and 148/152 is reduced slightly to 0.110 inches. The reason for this is that the electric field E is not perpendicular along the radially outward edges of the channels 155 and 156 and the electric field E is very intense near the resonator gaps 146–152. The remaining channel boundaries in this star-shaped pattern are either disposed substantially perpendicular to the electric field E, or the electric field E is very weak and the losses are low.

Tests have demonstrated that this embodiment of the invention results in an EPR signal from the sample in channels 155–158 that is 2.6 times greater (when sample holder 140 is PTFE) than the EPR signal produced with a conventional tube sample.

It should be apparent that many other sample holder structures are possible using the teachings of the present invention. Signal losses are minimized by orientating the sample channel boundary substantially perpendicular to the electric field in the resonator. When this is not possible, losses may be minimized by positioning the sample channel boundary in regions where the electric field intensity is very low. In addition, losses can be reduced by using sample holder materials having a low dielectric constant. Polymers having a dielectric constant of around 2.0 have been used in EPR, but it is a teaching of the present invention that the dielectric constant should be reduced substantially below 2.0 by forming micro-sized cavities, or pores in the polymer. Dielectric constants as low as 1.2 can be achieved.

The teachings of the present invention are also scalable to different frequencies. Not only are they scalable to different EPR frequencies, but they can also be employed in nuclear magnetic resonance spectroscopy which is performed at much lower frequencies.

The invention claimed is:

1. A sample holder for an electron paramagnetic resonance (EPR) spectrometer resonator that produces an electric field having a predetermined orientation, which comprises:
    a sample holder body formed from a dielectric material and shaped to fit within the EPR resonator where it is exposed to said electric field;
    a plurality of channels formed in the sample holder body for containing a sample material to be examined, each channel being shaped to form a boundary between the sample material and sample holder body which is substantially perpendicular to the electric field.

2. The sample holder as recited in claim 1 in which the sample holder body is formed from a material having a dielectric constant substantially less than 2.0.

3. The sample holder as recited in claim 1 in which the sample holder body is formed from a polymer foam.

4. The sample holder as recited in claim 1 in which each channel has a length and the cross-section of the channel along said length has a width greater than ten times its thickness.

5. The sample holder as recited in claim 4 in which the cross-sections of the plurality of channels are parallel to each other and the channels are equally spaced apart across an interior dimension of the EPR resonator.

6. The sample holder as recited in claim 4 in which the plurality of channels are equally spaced around a central axis and their width dimension extends radially with respect to the central axis.

7. The sample holder as recited in claim 6 in which each channel intersects the central axis and extends radially outward therefrom in opposite directions.

8. The sample holder as recited in claim 6 in which each channel is spaced radially outward from the central axis.

9. The sample holder as recited in claim 1 in which there are two channels, each having a length and a semi-circular cross-section along their length, the channels being separated by a web portion of said sample holder body.

10. The sample holder as recited in claim 9 in which the sample holder body is cylindrical in shape and has a circular cross-section.

11. The sample holder as recited in claim 4 in which there are two channels that intersect each other at right angles.

12. The sample holder as recited in claim 7 in which there are two channels that intersect each other at right angles.

13. The sample holder as recited in claim 7 in which there are four channels that intersect each other.

14. The sample holder as recited in claim 13 in which the EPR resonator is a loop-gap resonator having four gaps equally spaced around the periphery of the sample holder and two of the channels are aligned in planes defined by opposing pairs of gaps.

15. The sample holder as recited in claim 14 in which the radial dimension of said two channels is less than the radial dimension of the other two channels.

16. The sample holder as recited in claim 5 in which the spacing between each of the end channels that bound the plurality of channels and an adjacent EPR resonator wall is substantially one-half the spacing between successive channels.

17. The sample holder as recited in claim 1 in which the sample material has a high dielectric constant.

18. The sample holder as recited in claim 17 in which the sample material is predominantly water.

19. A method for manufacturing a sample holder for an electron paramagnetic resonance (EPR) spectrometer, the steps comprising:
 a) selecting a material having a low dielectric constant;
 b) extruding the material to form a sample holder body having a plurality of channels that extend along the length of the extrusion; and
 c) cutting the extrusion to a length for use in a resonator that forms part of the EPR spectrometer.

20. The method as recited in claim 19 in which the dielectric constant of the selected material is substantially less than 2.0.

21. The method as recited in claim 19 in which the selected material is a polymer foam.

22. The method as recited in claim 19 in which the selected material is polytetrafluoroethylene.

23. In an electron paramagnetic resonance (EPR) spectrometer having a resonator with a wall that defines a cavity in which a sample is placed for testing, the improvement comprising:
 a sample holder formed from a dielectric material and having a plurality of channels formed therein for containing a sample material, the channels being spaced across one dimension of the sample holder with equal spacing between channels and with spacing between each of the end channels that bound the plurality of channels and the adjacent end of the sample holder which is substantially one-half the spacing between channels; and
 a pair of conductive walls which abut opposing ends of he sample holder and connect with the EPR resonator wall to support the sample holder in the resonator cavity.

24. A resonator for a spectrometer which comprises:
 a loop-gap resonator having a conductive wall that encircles a central axis and a plurality of gaps in the conductive wall that extend the entire axial length thereof, the loop-gap resonator producing an electric field in the space defined by the conductive wall having an orientation determined by the number of gaps;
 a sample holder body formed from a dielectric material that is shaped to fit within the space defined by the conductive wall, the sample holder having a plurality of channels formed therein for containing a sample material to be examined, each channel being shaped to form a boundary between the sample material and the sample holder body which is substantially perpendicular to the electric field.

25. The resonator as recited in claim 24 in which there are two gaps and the sample holder has an outer wall that extends around the central axis and a web that extends across the interior of the sample holder to define two channels.

26. The resonator as recited in claim 24 in which there are four gaps and the sample holder has a plurality of radially directed channels passing through the central axis.

* * * * *